(12) United States Patent
Lai et al.

(10) Patent No.: US 11,942,469 B2
(45) Date of Patent: Mar. 26, 2024

(54) BACKSIDE CONDUCTING LINES IN INTEGRATED CIRCUITS

(71) Applicant: TAIWAN SEMICONDUCTOR MANUFACTURING COMPANY, LTD., Hsinchu (TW)

(72) Inventors: Wei-An Lai, Hsinchu (TW); Shih-Wei Peng, Hsinchu (TW); Te-Hsin Chiu, Hsinchu (TW); Jiann-Tyng Tzeng, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 297 days.

(21) Appl. No.: 17/344,411

(22) Filed: Jun. 10, 2021

(65) Prior Publication Data
US 2022/0254770 A1 Aug. 11, 2022

Related U.S. Application Data

(60) Provisional application No. 63/147,065, filed on Feb. 8, 2021.

(51) Int. Cl.
*H01L 27/118* (2006.01)
*G06F 30/39* (2020.01)
*H01L 27/02* (2006.01)

(52) U.S. Cl.
CPC .......... *H01L 27/0207* (2013.01); *G06F 30/39* (2020.01); *H01L 27/11803* (2013.01)

(58) Field of Classification Search
CPC .......... H01L 27/11807; H01L 27/0207; G06F 30/39
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,886,217 B2 * | 1/2021 | Morrow | H01L 29/7851 |
| 11,139,241 B2 * | 10/2021 | Morrow | G06F 30/392 |
| 11,276,677 B1 * | 3/2022 | Deng | H01L 27/0207 |
| 11,309,334 B2 * | 4/2022 | Lin | G11C 5/063 |
| 11,328,750 B1 * | 5/2022 | Amirante | H01L 23/535 |
| 11,404,374 B2 * | 8/2022 | Lim | H01L 23/481 |

(Continued)

FOREIGN PATENT DOCUMENTS

| | | |
|---|---|---|
| TW | 201208017 | 2/2012 |
| TW | 202105689 | 2/2021 |

*Primary Examiner* — Mounir S Amer
*Assistant Examiner* — Alexander Belousov
(74) *Attorney, Agent, or Firm* — Hauptman Ham, LLP

(57) ABSTRACT

An integrated circuit includes a first-type active-region structure, a second-type active-region structure on a substrate, and a plurality of gate-conductors. The integrated circuit also includes a backside horizontal conducting line in a backside first conducting layer below the substrate, a backside vertical conducting line in a backside second conducting layer below the backside first conducting layer, and a pin-connector for a circuit cell. The pin-connector is directly connected between the backside horizontal conducting line and the backside vertical conducting line. The backside horizontal conducting line extends across a vertical boundary of the circuit cell.

20 Claims, 18 Drawing Sheets

(56) References Cited

U.S. PATENT DOCUMENTS

| | | | |
|---|---|---|---|
| 11,557,583 B2* | 1/2023 | Chen | G06F 30/3953 |
| 11,616,015 B2* | 3/2023 | Morrow | H01L 21/823431 |
| | | | 257/401 |
| 2014/0040838 A1 | 2/2014 | Liu et al. | |
| 2015/0278429 A1 | 10/2015 | Chang | |
| 2019/0020343 A1* | 1/2019 | Lee | H01L 24/20 |
| 2019/0051641 A1* | 2/2019 | Lee | H01L 21/563 |
| 2019/0259699 A1* | 8/2019 | Morrow | H01L 29/785 |
| 2019/0312023 A1* | 10/2019 | Morrow | H01L 27/0207 |
| 2021/0104551 A1* | 4/2021 | Lin | G11C 13/0007 |
| 2021/0111115 A1* | 4/2021 | Morrow | H01L 21/823431 |
| 2022/0028779 A1* | 1/2022 | Morrow | H01L 21/823475 |
| 2022/0077134 A1* | 3/2022 | Chen | G06F 30/392 |
| 2022/0102266 A1* | 3/2022 | Lim | H01L 29/66545 |
| 2022/0147679 A1* | 5/2022 | Edathil | G06F 30/394 |
| 2022/0188496 A1* | 6/2022 | Edathil | G06F 30/327 |
| 2022/0223514 A1* | 7/2022 | Sisodia | H01L 27/092 |
| 2022/0223624 A1* | 7/2022 | Lin | G11C 14/0036 |

* cited by examiner

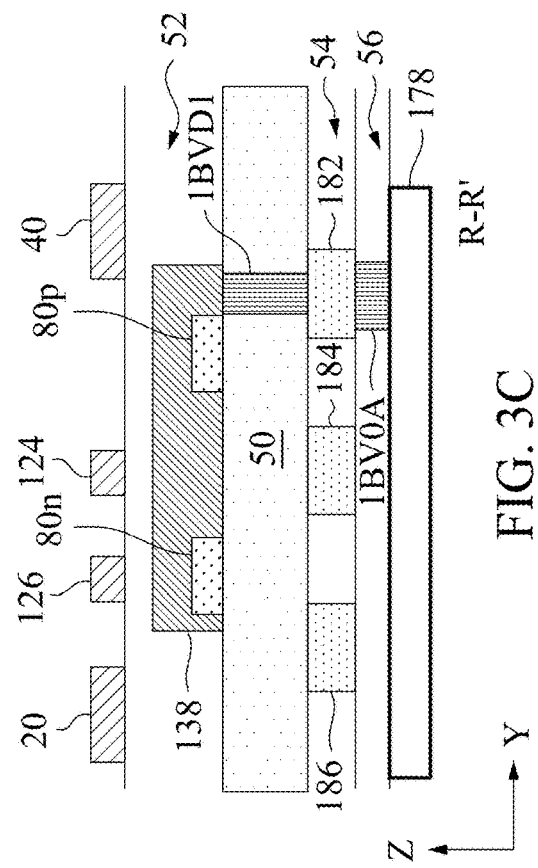
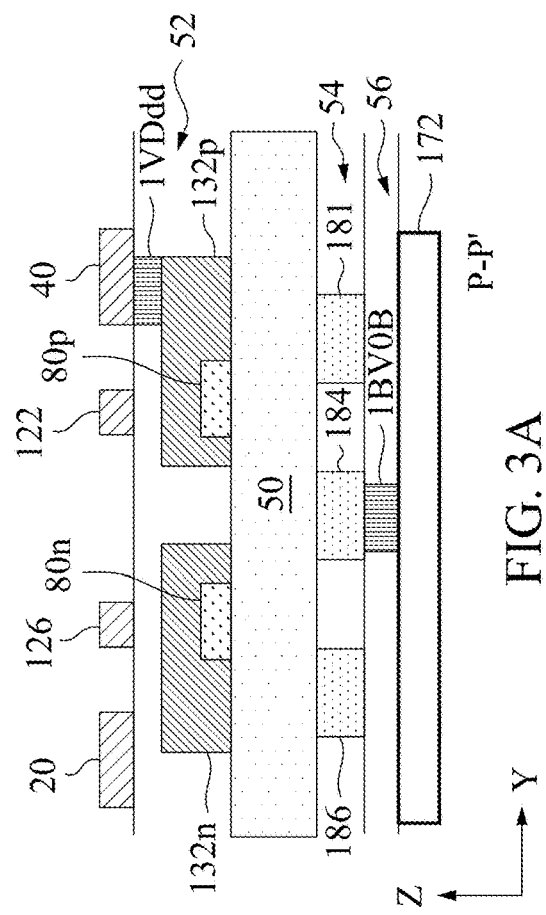
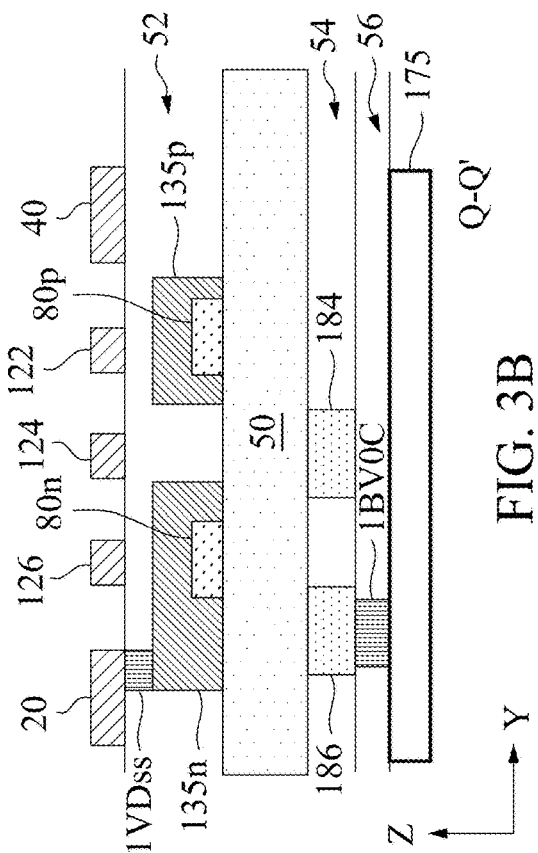

BACKSIDE CONDUCTING LINES IN INTEGRATED CIRCUITS

PRIORITY CLAIM AND CROSS-REFERENCE

The present application claims the priority of U.S. Provisional Application No. 63/147,065, filed Feb. 8, 2021, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C are cross-sectional views of the NOR circuit as specified by the layout diagrams in FIGS. 1A-1B, in accordance with some embodiments.

DETAILED DESCRIPTION

Figure 1A:
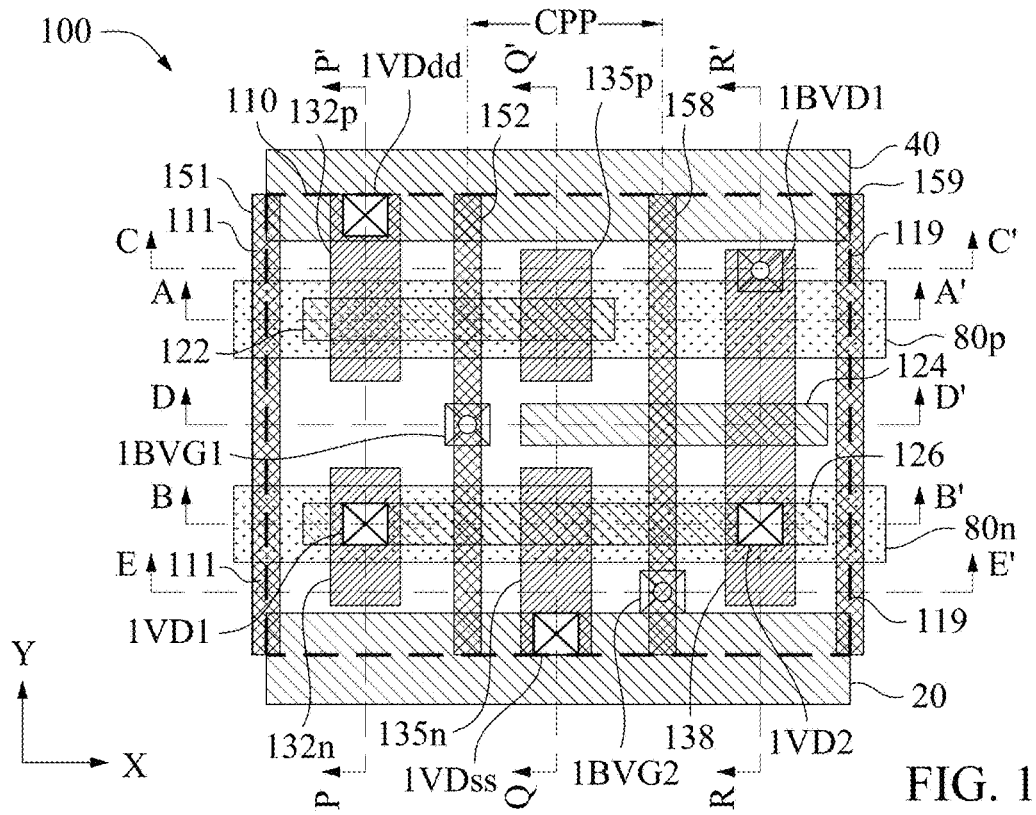
FIGS. 1A-1B are layout diagrams of a NOR gate circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated circuit includes gate-conductors and terminal-conductors at the front side of a substrate. The integrated circuit also includes backside horizontal conducting lines in a backside first conducting layer and backside vertical conducting lines in a backside second conducting layer at the backside of the substrate. A backside vertical conducting line of interest is aligned with a first vertical boundary of a circuit cell and is connected to a backside horizontal conducting line of interest through a pin-connector. In some embodiments, the backside horizontal conducting line of interest is an extended conducting line that extends across the first vertical boundary of the circuit cell. In some embodiments, the backside vertical conducting line of interest is a local two-dimensional conducting line which has a first portion with a first width and has a second portion with a second width that is different from the first width. In some embodiments, because of the extended conducting line and/or the local two-dimensional conducting line, more flexibility is provided for the positioning of the pin-connector without generating design rule violations.

Figure 1B:
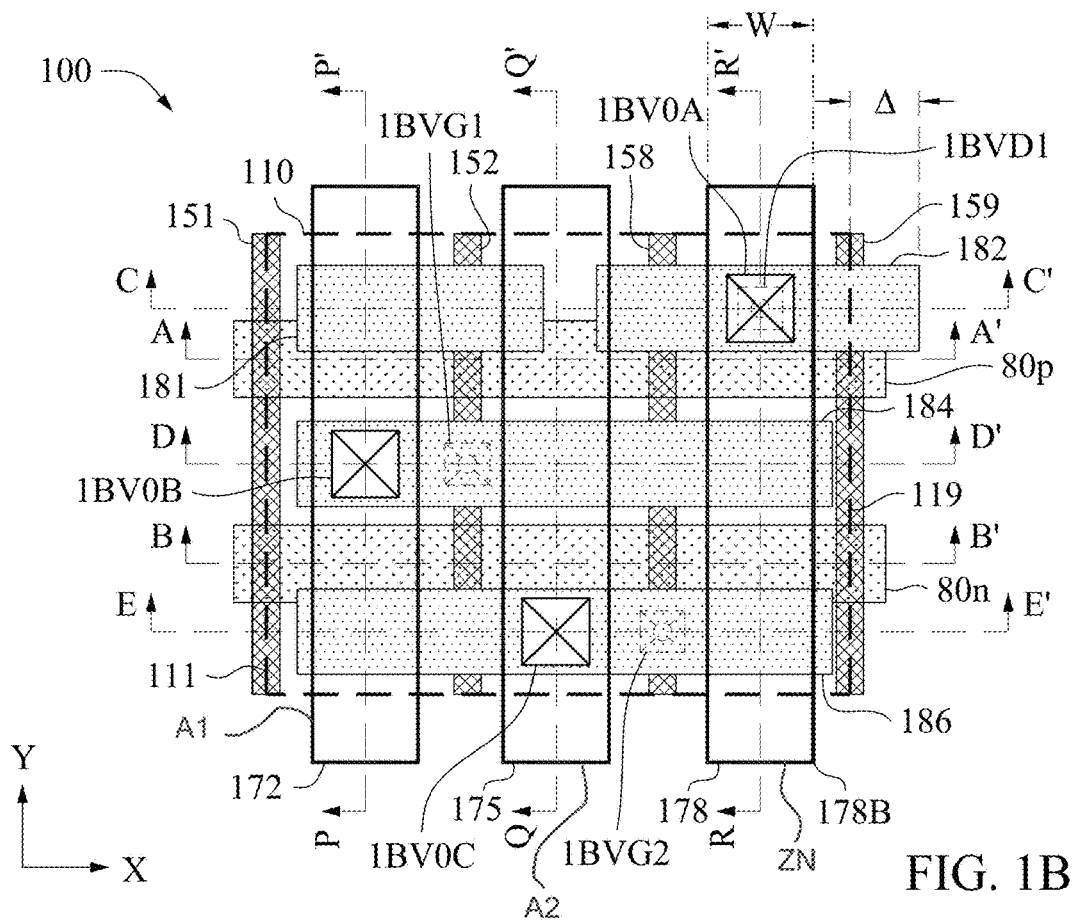

FIGS. 1A-1B are layout diagrams of a NOR gate circuit 100, in accordance with some embodiments. The layout diagrams of FIGS. 1A-1B include the layout patterns for specifying a p-type active-region structure 80p and an n-type active-region structure 80n both extending in the X-direction, gate-conductors (152 and 158) extending in the Y-direction, terminal-conductors (132p, 132n, 135p, 135n, and 138) extending in the Y-direction, and dummy gate-conductors (151 and 159) extending in the Y-direction. The NOR gate circuit 100 is in a cell that is bounded by cell boundaries 110, and the cell width along the X-direction is bounded by two vertical cell boundaries 111 and 119 extending in the Y-direction. The layout diagram of FIG. 1A also includes the layout patterns for specifying the power rails (40 and 20) extending in the X-direction, the front-side first-layer conducting lines (122, 124, and 126) extending in the X-direction, and various via-connectors. The layout diagram of FIG. 1B also includes the layout patterns for specifying the backside horizontal conducting lines (181, 182, 184, and 186) extending in the X-direction, the backside vertical conducting lines (172, 175, and 178) extending in the Y-direction, and various via-connectors. In the X-Y coordinate, the X-direction and the Y-direction are perpendicular to each other.

In the NOR gate circuit 100 as specified by the layout diagrams of FIGS. 1A-1B, two adjacent gate-conductors (such as the gate-conductors 152 and 158) are separated by a pitch distance equal to a contacted poly pitch (CPP). In the NOR gate circuit 100, a distance between the vertical cell boundary 111 and the vertical cell boundary 119 along in the X-direction is three CPPs.

Figure 1C:
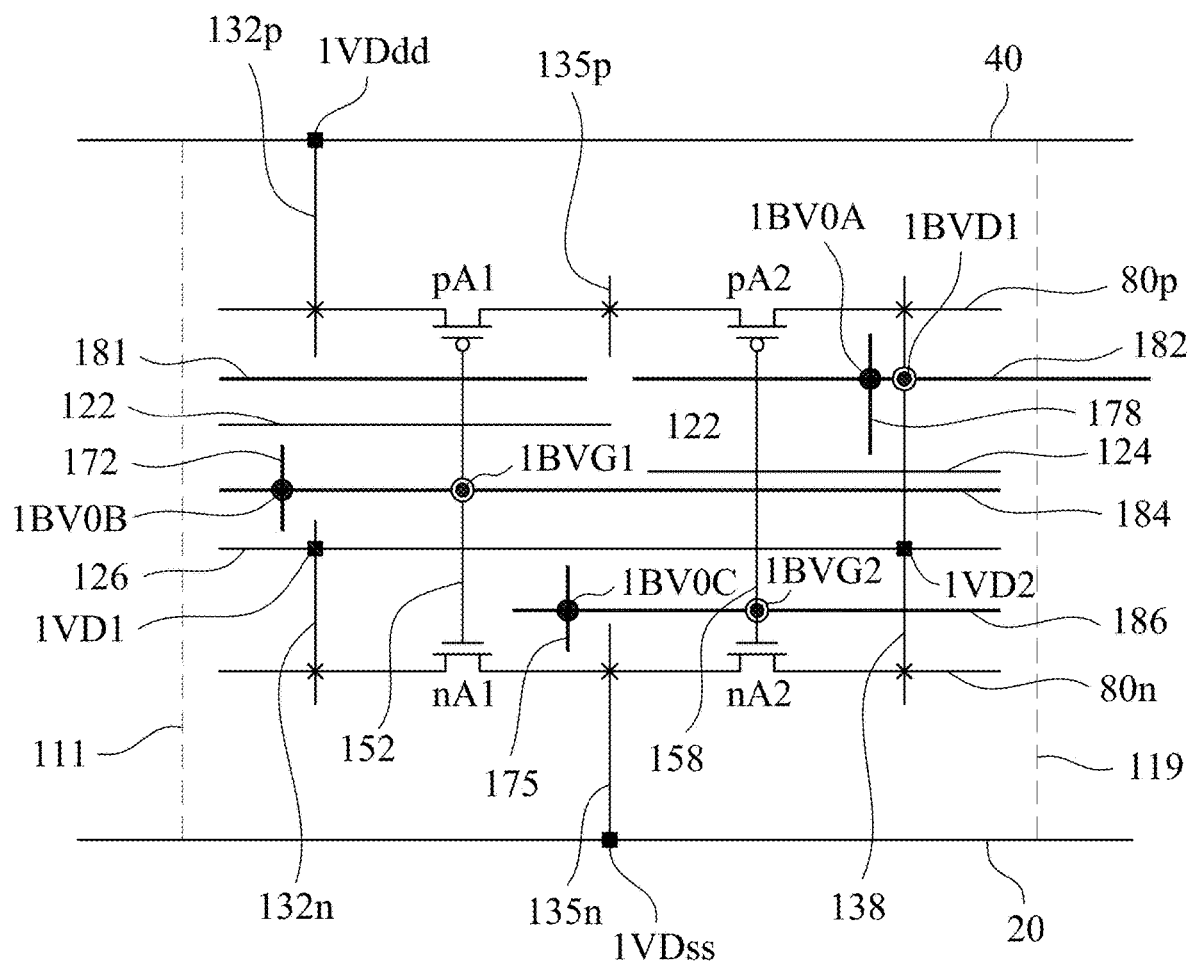
FIG. 1C is an equivalent circuit of the NOR circuit as specified by the layout diagrams in FIGS. 1A-1B, in accordance with some embodiments.

FIG. 1C is an equivalent circuit of the NOR gate circuit 100 as specified by the layout diagrams in FIGS. 1A-1B, in accordance with some embodiments. FIGS. 2A-2E and FIGS. 3A-3C are cross-sectional views of the NOR gate circuit 100 as specified by the layout diagrams in FIGS. 1A-1B, in accordance with some embodiments.

In the NOR gate circuit 100 as specified by the layout diagrams of FIGS. 1A-1B and as shown in the equivalent circuit of FIG. 1C, the gate-conductor 152 intersects the p-type active-region structure 80p at the channel region of a p-type transistor pA1, and intersects the n-type active-region structure 80n at the channel region of an n-type transistor nA1. The gate-conductor 158 intersects the p-type active-region structure 80p at the channel region of a p-type transistor pA2, and intersects the n-type active-region structure 80n at the channel region of an n-type transistor nA2. The terminal-conductors 132p and 135p intersect the p-type active-region structure 80p at various source/drain regions of the p-type transistor pA2 and pA1. The terminal-conductors 132n and 135n intersect the n-type active-region structure 80n at various source/drain regions of the n-type transistor nA2 and nA1. The terminal-conductor 138 intersect the p-type active-region structure 80p and the n-type active-region structure 80n correspondingly at the drain region of the p-type transistor pA1 and at the drain region of the n-type transistor nA1. Non-limiting examples of the p-type transistors (pA1 and pA2) and the n-type transistors (nA1 and nA2) include FinFETs, nano-sheet transistors, and nano-wire transistors. The layout patterns for the dummy gate-conductors 151 and 159 in FIGS. 1A-1B specify that the active regions (such as, source regions, drain regions, and channel regions) in the NOR gate circuit 100 are isolated from the active regions in adjacent cells.

In the NOR gate circuit 100 as specified by the layout diagrams of FIGS. 1A-1B and as shown in the equivalent circuit of FIG. 1C, the front-side first-layer conducting lines (122, 124, and 126) and the power rails (40 and 20) are positioned in a first connection layer above the substrate. In some embodiments, the first connection layer is the first metal layer M0 above the top insulation layer fabricated in the front-end-of-line (FEOL) process. In the NOR gate circuit 100, the terminal-conductor 132p is conductively connected to the power rail 40 through the via-connector 1VDdd, and the power rail 40 is configured for providing a first supply voltage VDD. The terminal-conductor 135n is conductively connected to the power rail 20 through the via-connector 1VDss, and the power rail 20 is configured for providing a second supply voltage VSS. The front-side first-layer conducting line 126 is conductively connected to the terminal-conductor 132n through the via-connector 1VD1 and conductively connected to the terminal-conductor 138 through the via-connector 1VD2.

In the NOR gate circuit 100, the terminal-conductor 138 (in FIG. 1A) is also conductively connected to the backside horizontal conducting line 182 (in FIG. 1B) through the via-connector 1BVD1 that passes through the substrate. Additionally, the gate-conductor 152 (in FIG. 1A) is conductively connected to the backside horizontal conducting line 184 (in FIG. 1B) through the via-connector 1BVG1, and the gate-conductor 158 (in FIG. 1A) is conductively connected to the backside horizontal conducting line 186 (in FIG. 1B) through the via-connector 1BVG2.

In the NOR gate circuit 100, the backside horizontal conducting line 182 is conductively connected to the backside vertical conducting line 178 through the via-connector 1BV0A. The backside horizontal conducting line 184 is conductively connected to the backside vertical conducting line 172 through the via-connector 1BV0B. The backside horizontal conducting line 186 is conductively connected to the backside vertical conducting line 175 through the via-connector 1BV0C.

In the NOR gate circuit 100, the backside horizontal conducting lines 181, 182, 184, and 186 are in a backside first conducting layer below the substrate. The backside vertical conducting lines 172, 175, and 178 are in a backside second conducting layer that is below the backside first conducting layer. In some embodiments, the backside first conducting layer is the first backside metal layer BM0 fabricated at the backside of the substrate, and the backside second conducting layer is the second backside metal layer BM1 fabricated at the backside of the substrate. The first backside metal layer BM0 is sandwiched between the substrate and the second backside metal layer BM1. Each of the via-connectors 1BV0A, 1BV0B, and 1BV0C is a via-connector BVO that passes through the interlayer dielectric (ILD) materials separating the second backside metal layer BM1 and the first backside metal layer BM0.

In the NOR gate circuit 100, the backside vertical conducting line 172, the via-connector 1BV0B, and the backside horizontal conducting line 184 are conductively connected together to carry an input signal "A1" of the NOR gate circuit 100. The backside vertical conducting line 175, the via-connector 1BV0C, and the backside horizontal conducting line 186 are conductively connected together to carry an input signal "A2" of the NOR gate circuit 100. The backside vertical conducting line 178, the via-connector 1BV0A, and the backside horizontal conducting line 182 are conductively connected together to carry an output signal "ZN" of the NOR gate circuit 100.

In the NOR gate circuit 100, the via-connector 1BV0A (as shown in FIG. 1C) functions as a pin-connector extending in the Z-direction for connecting the backside vertical conducting line 178 to the backside horizontal conducting line 182 that carries the output signal "ZN" of the NOR gate circuit 100. In some embodiments, as shown in FIG. 1B, when the backside horizontal conducting line 182 extends across the vertical cell boundary 119, more flexibility is provided for the positioning of the pin-connector (i.e., the via-connector 1BV0A) without generating design rule violations. In FIG. 1B, the backside horizontal conducting line 182 extends across the vertical cell boundary 119 by a distance "Δ" extending in the X-direction. In some embodiments, the backside horizontal conducting line 182 extends across the vertical cell boundary 119 by a distance "Δ" that is less than one CPP but more than one eighth of the CPP. In some embodiments, the backside horizontal conducting line 182 extends across the vertical cell boundary 119 by a distance "Δ" that is less than one CPP but more than one fourth of the CPP. In some embodiments, the backside horizontal conducting line 182 extends across the vertical cell boundary 119 by a distance "Δ" that is less than one CPP but more than one half of the CPP. In some embodiments, the distance "Δ"

is selected to be sufficiently large to mitigate the design rule violations associated with the pin-connector connection between the backside vertical conducting line 178 and the backside horizontal conducting line 182. In some embodiments, the distance "Δ" is selected to be less than one CPP so that the horizontal gap distance from the vertical cell boundary 119 to the vertical cell boundary of the adjacent cell is reduced to a minimal distance for mitigating the design rule violations associated with the pin-connector connection.

In FIG. 1B, the backside vertical conducting line 178 has a width "W" extending in the X-direction. In some embodiments, the width "W" is selected to reduce the IR drops in the backside vertical conducting line 178. In some embodiments, the width "W" of the backside vertical conducting line 178 is larger than one half of the CPP. In some embodiments, the width "W" of the backside vertical conducting line 178 is larger than three fourths of the CPP. Generally, the larger the width "W", the smaller the IR drops in the backside vertical conducting line 178. The spacing requirements between adjacent backside vertical conducting lines, however, limit the maximum value of the width "W", if the number of the tracks for the backside vertical conducting lines in a cell is fixed. Decreasing the number of the tracks may increase the maximum value of the width "W", but routing flexibility for the cell design is reduced at the same time. In some embodiments, the compromise between the routing flexibility and the IR drop requirements determines the maximum value of the width "W".

Figure 2A:
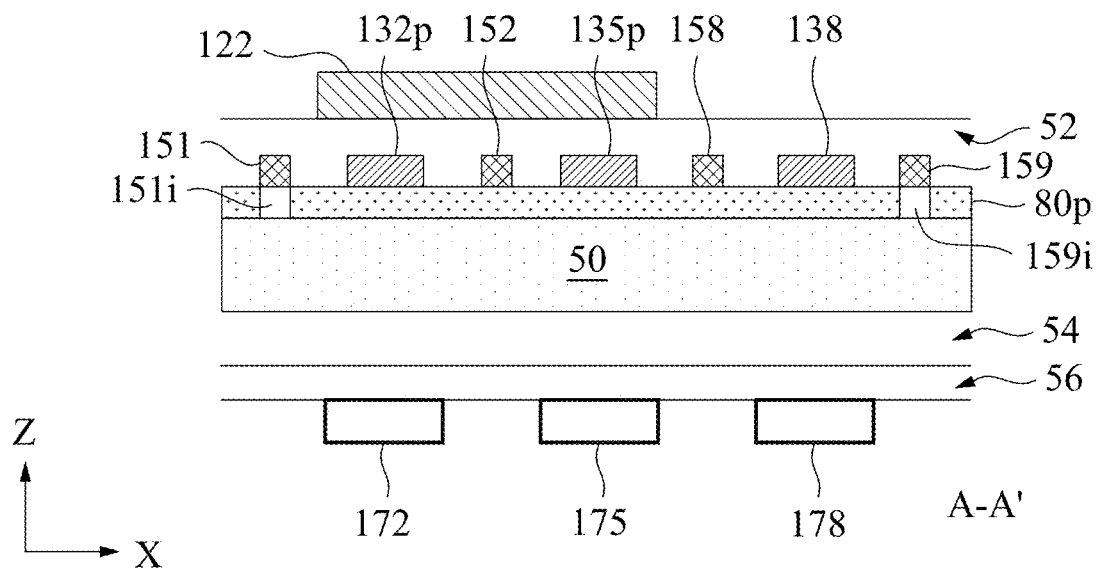
FIGS. 2A-2E are cross-sectional views of the NOR circuit as specified by the layout diagrams in FIGS. 1A-1B, in accordance with some embodiments.

FIG. 2A is a cross-sectional view of the NOR gate circuit 100 as specified by the layout diagrams in FIGS. 1A-1B in a cutting plane A-A', in accordance with some embodiments. As shown in FIG. 2A, the p-type active-region structure 80p is on the substrate 50. Each of the terminal-conductors 132p, 135p, and 138 intersects the p-type active-region structure 80p. Each of the gate-conductors 152 and 158 also intersects the p-type active-region structure 80p. In some embodiments, the active regions (such as, the source region, the channel region, or the drain region) in the p-type active-region structure 80p are isolated from the active regions in the adjacent cells, by the boundary isolation region 151i under the dummy gate-conductor 151 and the boundary isolation region 159i under the dummy gate-conductor 159. The front-side first-layer conducting line 122 overlies the insulation layer 52 which covers the gate-conductors (152 and 158) and the terminal-conductors (132p, 135p, and 138). The backside vertical conducting lines 172, 175, and 178 are positioned on the backside interlayer dielectric 56 which overlies the backside interlayer dielectric 54 at the backside of the substrate 50.

Figure 2B:
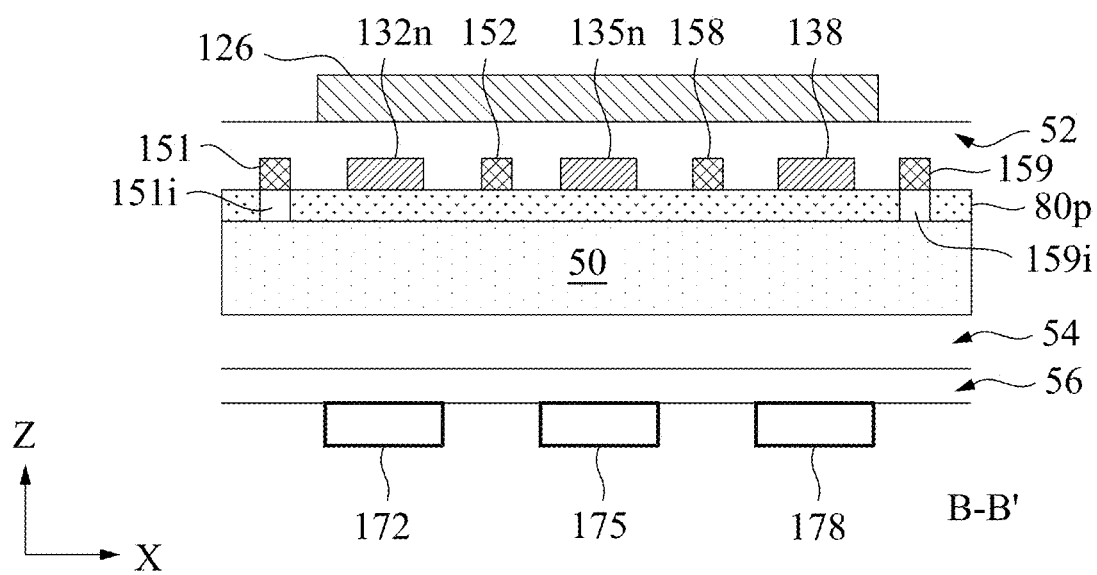

FIG. 2B is a cross-sectional view of the NOR gate circuit 100 as specified by the layout diagrams in FIGS. 1A-1B in a cutting plane B-B', in accordance with some embodiments. As shown in FIG. 2B, the n-type active-region structure 80n is on the substrate 50. Each of the terminal-conductors 132n, 135n, and 138 intersects the n-type active-region structure 80n. Each of the gate-conductors 152 and 158 also intersects the n-type active-region structure 80n. In some embodiments, the active regions (such as, the source region, the channel region, or the drain region) in the n-type active-region structure 80n are isolated from the active regions in the adjacent cells, by the boundary isolation region 151i under the dummy gate-conductor 151 and the boundary isolation region 159i under the dummy gate-conductor 159. The front-side first-layer conducting line 126 overlies the insulation layer 52 which covers the gate-conductors (152 and 158) and the terminal-conductors (132n, 135n, and 138). The backside vertical conducting lines 172, 175, and 178 are positioned on the backside interlayer dielectric 56 which overlies the backside interlayer dielectric 54 at the backside of the substrate 50.

Figure 2C:
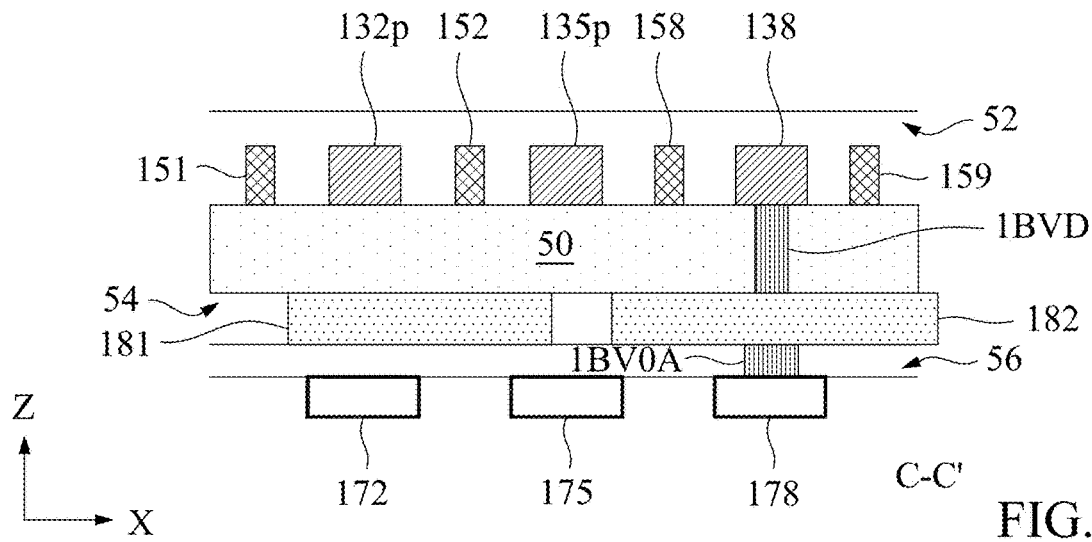

FIG. 2C is a cross-sectional view of the NOR gate circuit 100 as specified by the layout diagrams in FIGS. 1A-1B in a cutting plane C-C', in accordance with some embodiments. As shown in FIG. 2C, the insulation layer 52 covers the gate-conductors (152 and 158), the terminal-conductors (132p, 135p, and 138), and the dummy gate-conductors (151 and 159). The backside horizontal conducting lines 181 and 182 are positioned at the backside of the substrate 50. Portions of the backside interlayer dielectric 54 separate the backside horizontal conducting line 181 from the backside horizontal conducting line 182. The backside vertical conducting lines 172, 175, and 178 are positioned on the backside interlayer dielectric 56 which covers the backside interlayer dielectric 54 and the backside horizontal conducting lines 181 and 182. The via-connector 1BVD1 passes through the substrate 50 and conductively connects the terminal-conductor 138 with the backside horizontal conducting line 182. The via-connector 1BV0A passes through the backside interlayer dielectric 56 and conductively connects the backside horizontal conducting line 182 with the backside vertical conducting line 178.

Figure 2D:
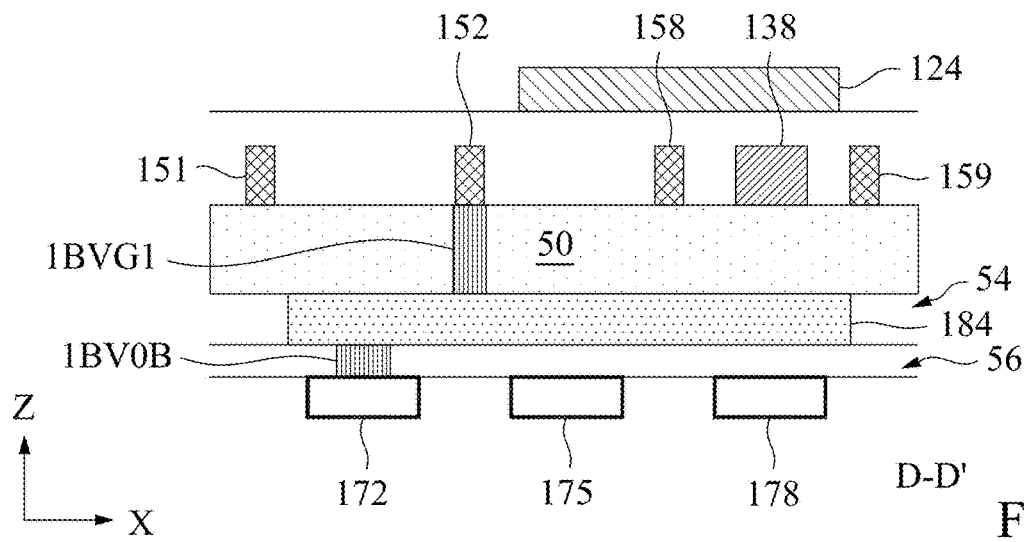

FIG. 2D is a cross-sectional view of the NOR gate circuit 100 as specified by the layout diagrams in FIGS. 1A-1B in a cutting plane D-D', in accordance with some embodiments. As shown in FIG. 2D, the insulation layer 52 covers the gate-conductors (152 and 158), the terminal-conductor 138, and the dummy gate-conductors (151 and 159). The backside horizontal conducting line 184 is positioned at the backside of the substrate 50. The backside vertical conducting lines 172, 175, and 178 are positioned on the backside interlayer dielectric 56 which covers the backside interlayer dielectric 54 and the backside horizontal conducting line 184.

In FIG. 2D, the via-connector 1BVG1 passes through the substrate 50 and conductively connects the gate-conductor 152 with the backside horizontal conducting line 184. The via-connector 1BV0B passes through the backside interlayer dielectric 56 and conductively connects the backside horizontal conducting line 184 with the backside vertical conducting line 172.

Figure 2E:
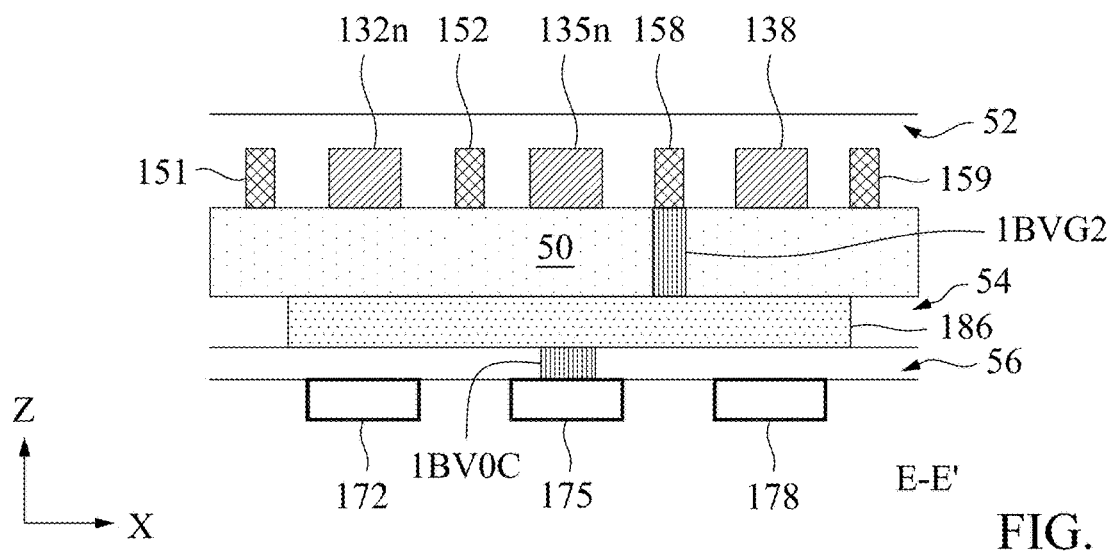

FIG. 2E is a cross-sectional view of the NOR gate circuit 100 as specified by the layout diagrams in FIGS. 1A-1B in a cutting plane E-E', in accordance with some embodiments. As shown in FIG. 2E, the insulation layer 52 covers the gate-conductors (152 and 158), the terminal-conductors (132n, 135n, and 138), and the dummy gate-conductors (151 and 159). The backside horizontal conducting line 186 is positioned at the backside of the substrate 50. The backside vertical conducting lines 172, 175, and 178 are positioned on the backside interlayer dielectric 56 which covers the backside interlayer dielectric 54 and the backside horizontal conducting line 186. The via-connector 1BVG2 passes through the substrate 50 and conductively connects the gate-conductor 158 with the backside horizontal conducting line 186. The via-connector 1BV0C passes through the backside interlayer dielectric 56 and conductively connects the backside horizontal conducting line 186 with the backside vertical conducting line 175.

FIG. 3A is a cross-sectional view of the NOR gate circuit 100 as specified by the layout diagrams in FIGS. 1A-1B in a cutting plane P-P', in accordance with some embodiments. As shown in FIG. 3A, the terminal-conductor 132n intersects the n-type active-region structure 80n on the substrate 50, and the terminal-conductor 132*p* intersects the p-type active-region structure 80*p* on the substrate 50. The insulation layer 52 covers the terminal-conductors 132*n* and 132*p*. The power rails (40 and 20) and the front-side first-layer conducting lines 122 and 126 are in the first connection layer overlying the insulation layer 52. The via-connector 1VDdd passes through the insulation layer 52 and conductively connects the terminal-conductor 132*p* with the power rail 40. The backside horizontal conducting lines 181, 184, and 186 are positioned at the backside of the substrate 50. The backside interlayer dielectric 54 and the backside horizontal conducting lines 181, 184, and 186 are covered by the backside interlayer dielectric 56. The backside vertical conducting line 172 overlies the backside interlayer dielectric 56. The via-connector 1BV0B passes through the backside interlayer dielectric 56 and conductively connects the backside horizontal conducting line 184 with the backside vertical conducting line 172.

FIG. 3B is a cross-sectional view of the NOR gate circuit 100 as specified by the layout diagrams in FIGS. 1A-1B in a cutting plane Q-Q', in accordance with some embodiments. As shown in FIG. 3B, the terminal-conductor 135*n* intersects the n-type active-region structure 80*n* on the substrate 50, and the terminal-conductor 135*p* intersects the p-type active-region structure 80*p* on the substrate 50. The insulation layer 52 covers the terminal-conductors 135*n* and 135*p*. The power rails (20 and 40) and the front-side first-layer conducting lines 122, 124, and 126 are in the first connection layer overlying the insulation layer 52. The via-connector 1VDss passes through the insulation layer 52 and conductively connects the terminal-conductor 135*n* with the power rail 20. The backside horizontal conducting lines 184 and 186 are positioned at the backside of the substrate 50. The backside interlayer dielectric 54 and the backside horizontal conducting lines 184 and 186 are covered by the backside interlayer dielectric 56. The backside vertical conducting line 175 overlies the backside interlayer dielectric 56. The via-connector 1BV0C passes through the backside interlayer dielectric 56 and conductively connects the backside horizontal conducting line 186 with the backside vertical conducting line 175.

FIG. 3C is a cross-sectional view of the NOR gate circuit 100 as specified by the layout diagrams in FIGS. 1A-1B in a cutting plane R-R', in accordance with some embodiments. As shown in FIG. 3C, the terminal-conductor 138 intersects the n-type active-region structure 80*n* and the p-type active-region structure 80*p* on the substrate 50. The insulation layer 52 covers the terminal-conductor 138. The power rails (20 and 40) and the front-side first-layer conducting lines 124 and 126 are in the first connection layer overlying the insulation layer 52. The backside horizontal conducting lines 182, 184, and 186 are positioned at the backside of the substrate 50. The via-connector 1BVD1 passes through the substrate 50 and conductively connects the terminal-conductor 138 with the backside horizontal conducting line 182. The backside interlayer dielectric 54 and the backside horizontal conducting lines 182, 184 and 186 are covered by the backside interlayer dielectric 56. The backside vertical conducting line 178 overlies the backside interlayer dielectric 56. The via-connector 1BV0A passes through the backside interlayer dielectric 56 and conductively connects the backside horizontal conducting line 182 with the backside vertical conducting line 178.

In the NOR gate circuit 100 as specified by the layout diagrams of FIGS. 1A-1B, the backside vertical conducting line 178 has a uniform width "W" at the backside of the substrate 50. In some alternative embodiments, at least one backside vertical conducting line includes a first portion having a first width and a second portion having a second width, and the first width of the first portion is larger than the second width of the second portion. As examples, in the NOR gate circuits as specified by the layout diagrams of FIGS. 4A-4E (which are described in more detail in the following), the first portion of the of the backside vertical conducting line 178 has a first width "Wa" and the second portion of the of the backside vertical conducting line 178 has a second width "Wb," where the first width "Wa" is larger than the second width "Wb."

FIGS. 4A-4E are layout diagrams of an NOR gate circuit 400, in accordance with some embodiments. Each of the layout diagrams in FIGS. 4A-4E include the layout patterns for specifying the backside horizontal conducting lines (181, 182, 184, and 186) and the backside vertical conducting lines (172, 175, and 178). The layout of the elements in the NOR gate circuit 400 at the backside of the substrate (as shown in FIGS. 4A-4E) is different from the layout of the elements in the NOR gate circuit 100 at the backside of the substrate (as shown in FIG. 1B). The layout of the elements in the NOR gate circuit 400 at the front-side of the substrate, however, is the same as the layout of the elements in the NOR gate circuit 100 at the front-side of the substrate (as shown in FIG. 1A). Consequently, for the NOR gate circuit 400, only the layout of the elements at the backside of the substrate are described in detail with reference to the layout diagrams of FIGS. 4A-4E, and the layout of the elements at the front-side are not described again with reference to front-side layout diagrams.

As specified by the layout diagrams in FIGS. 4A-4E, the NOR gate circuit 400 includes backside horizontal conducting lines 181, 182, 184, and 186 in a backside first conducting layer below the substrate. The NOR gate circuit 400 also includes backside vertical conducting lines 172, 175, and 178 in a backside second conducting layer that is below the backside first conducting layer. The gate-conductor 152 is conductively connected to the backside horizontal conducting line 184 through the via-connector 1BVG1, and the backside horizontal conducting line 184 is conductively connected to the backside vertical conducting line 172 through the via-connector 1BV0B. The gate-conductor 158 is conductively connected to the backside horizontal conducting line 186 through the via-connector 1BVG2, and the backside horizontal conducting line 186 is conductively connected to the backside vertical conducting line 175 through the via-connector 1BV0C. The terminal-conductor 138 (in FIG. 1A) is conductively connected to the backside horizontal conducting line 182 through the via-connector 1BVD1, and the backside horizontal conducting line 182 is conductively connected to the backside vertical conducting line 178 through the via-connector 1BV0A.

As specified by the layout diagrams of FIGS. 4A-4E, in the NOR gate circuit 400, the backside vertical conducting line 178 includes a first portion 178A and a second portion 178B. The first portion 178A covers an overlap region between the backside horizontal conducting line 182 and the backside vertical conducting line 178, while the second portion 178B is outside the overlap region. The first portion 178A has a first width "Wa" and the second portion has a second width "Wb." The first width "Wa" is larger than the second width "Wb." In some embodiments, the first width "Wa" is larger than the second width "Wb" by an amount that is more than one eighth of one CPP. In some embodiments, the first width "Wa" is larger than the second width "Wb" by an amount that is more than one fourth of one CPP. In some embodiments, the first width "Wa" is sufficiently larger than the second width "Wb" to allow the positioning of the pin-connector 1BV0A without generating design rule violations. In some embodiments, the flexibility of positioning pin-connectors for circuit cells having cell widths less than or equal to three CPPs improves the layout area coverages in integrated circuit designs.

Figure 4A:
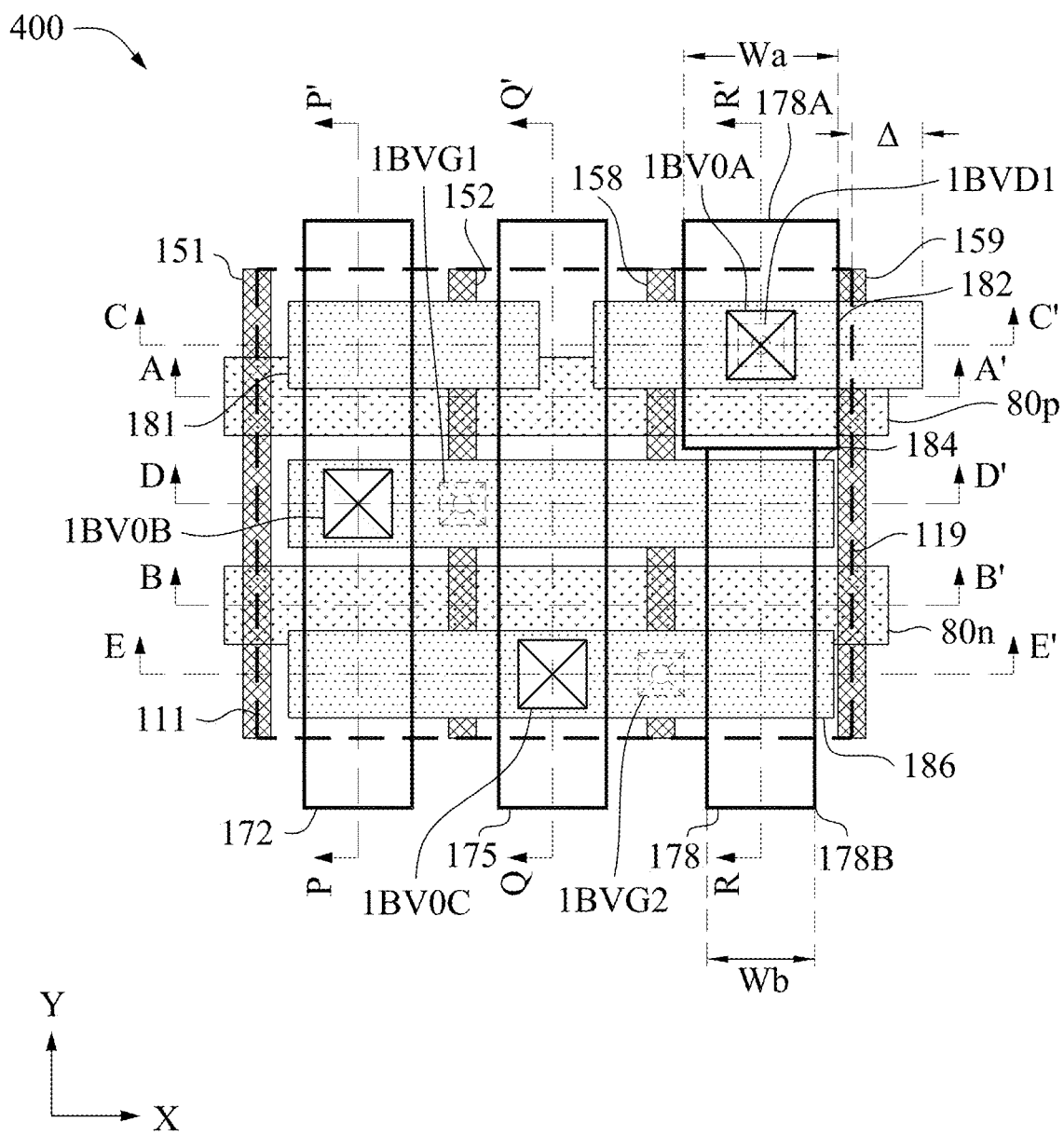
FIGS. 4A-4E are layout diagrams of a NOR gate circuit, in accordance with some embodiments.

In some embodiments, such as in the NOR gate circuit 400 of FIG. 4A, the backside horizontal conducting line 182 extends across the vertical cell boundary 119 by a distance "Δ" extending in the X-direction. In some embodiments, the backside horizontal conducting line 182 extends across the vertical cell boundary 119 by a distance "Δ" that is less than one CPP but more than one eighth of the CPP. In some embodiments, the backside horizontal conducting line 182 extends across the vertical cell boundary 119 by a distance "Δ" that is less than one CPP but more than one fourth of the CPP. In some embodiments, the backside horizontal conducting line 182 extends across the vertical cell boundary 119 by a distance "Δ" that is less than one CPP but more than one half of the CPP. In some embodiments, the distance "Δ" is selected to be sufficiently large to mitigate the design rule violations associated with the pin-connector connection between the backside vertical conducting line 178 and the backside horizontal conducting line 182. In some embodiments, the distance "Δ" is selected to be less than one CPP so that the horizontal gap distance from the vertical cell boundary 119 to the vertical cell boundary of the adjacent cell is reduced to a minimal distance for mitigating the design rule violations associated with the pin-connector connection.

Figure 4B:
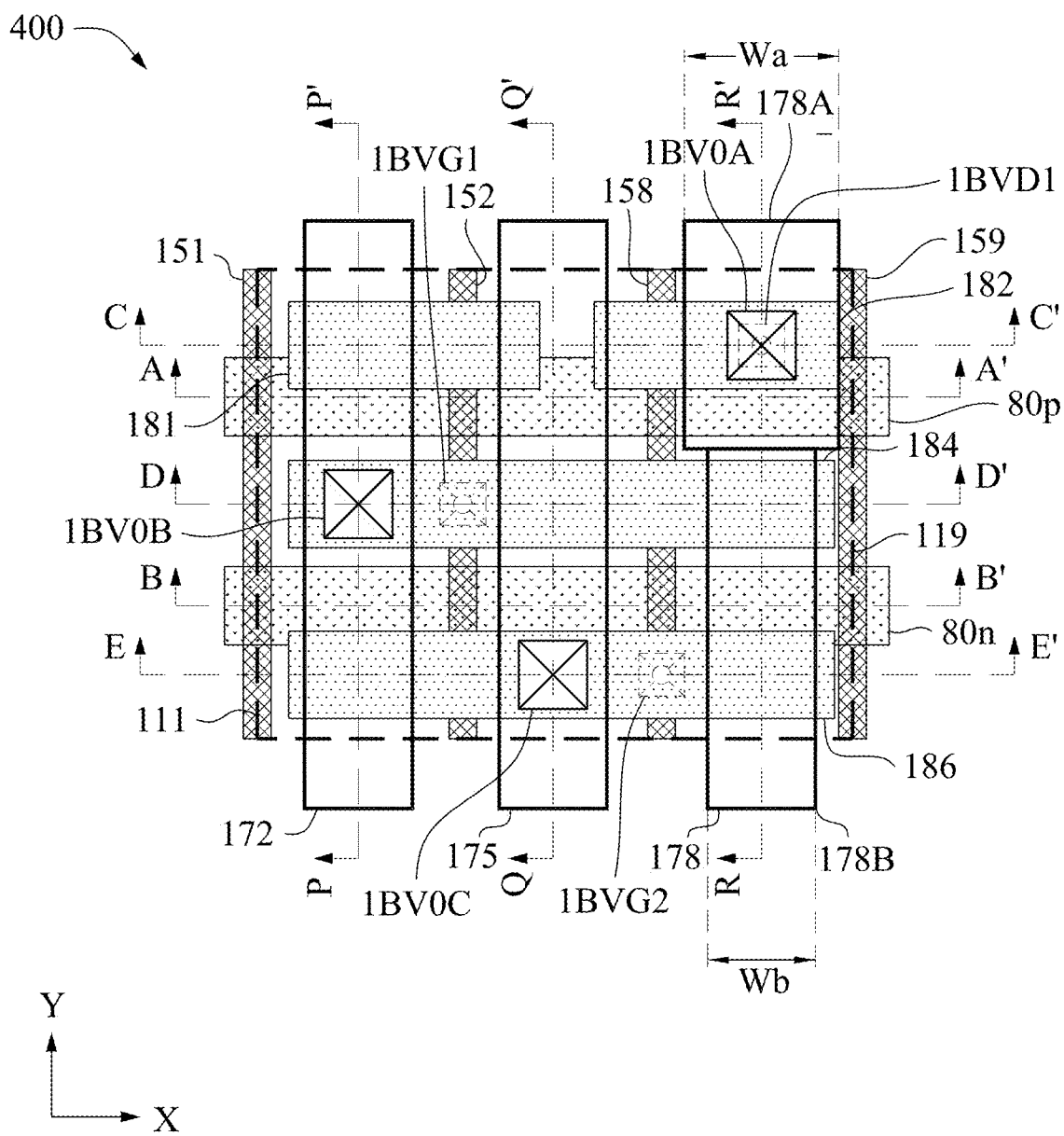
Figure 4C:
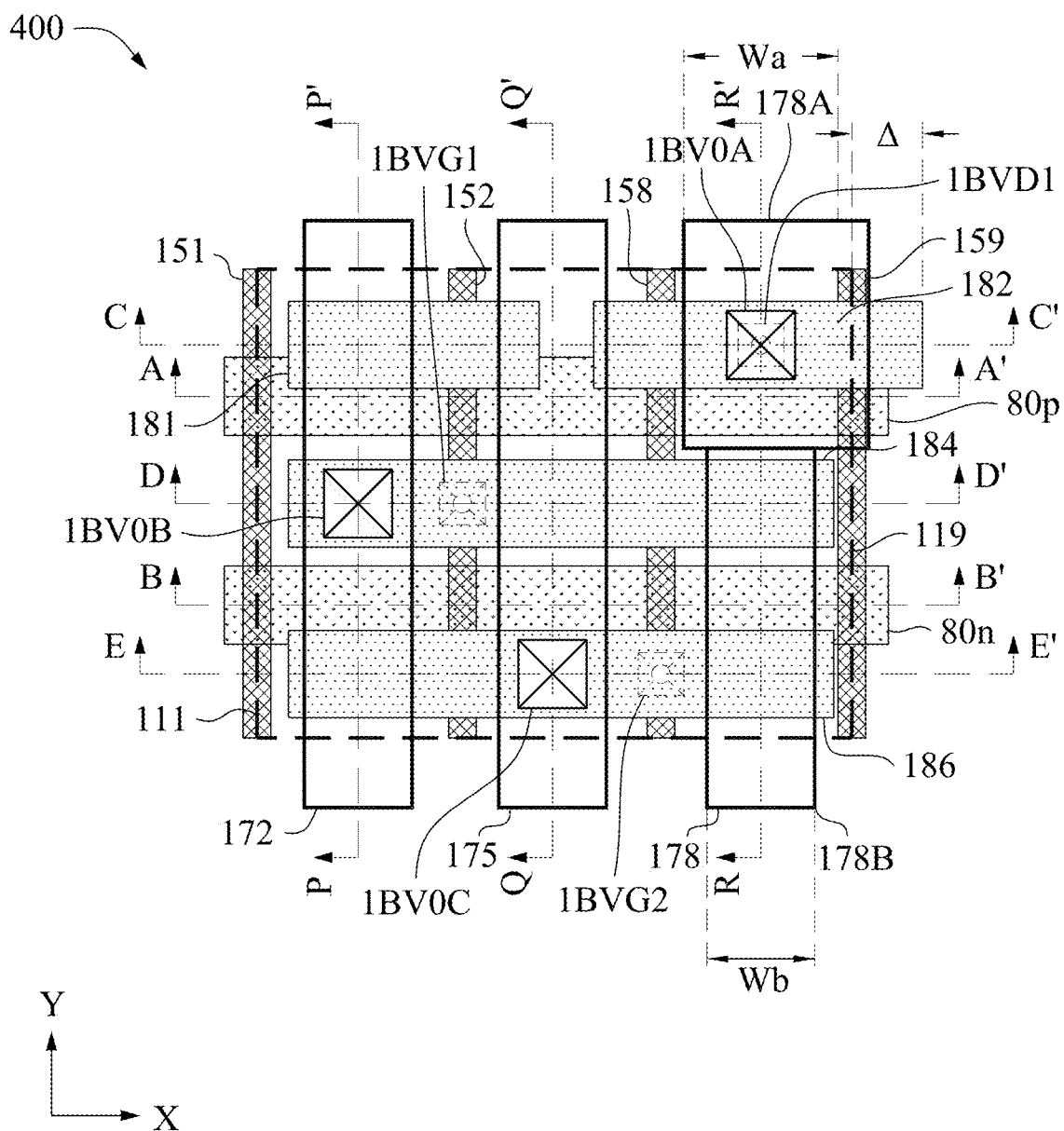
Figure 4D:
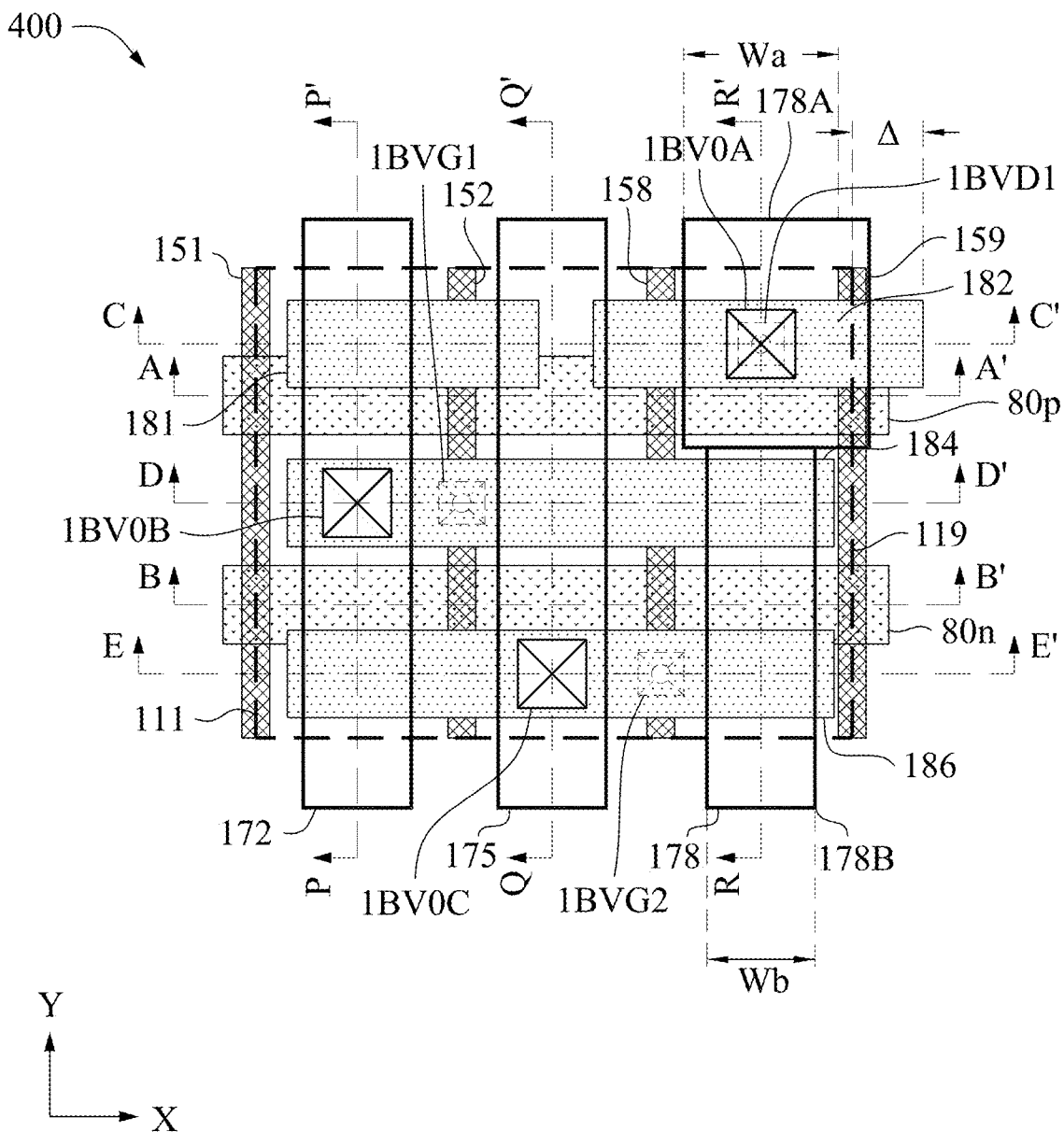

In some embodiments, such as in the NOR gate circuit 400 of FIG. 4B, the backside horizontal conducting line 182 extends across the vertical cell boundary 119. In some embodiments, such as in the NOR gate circuit 400 of FIG. 4C, the first portion 178A of the backside vertical conducting line 178 extends across the vertical cell boundary 119, while the second portion 178B of the backside vertical conducting line 178 does not extend across the vertical cell boundary 119. In some embodiments, such as in the NOR gate circuit 400 of FIG. 4D, both the first portion 178A and the second portion 178B of the backside vertical conducting line 178 extend across the vertical cell boundary 119.

Figure 4E:
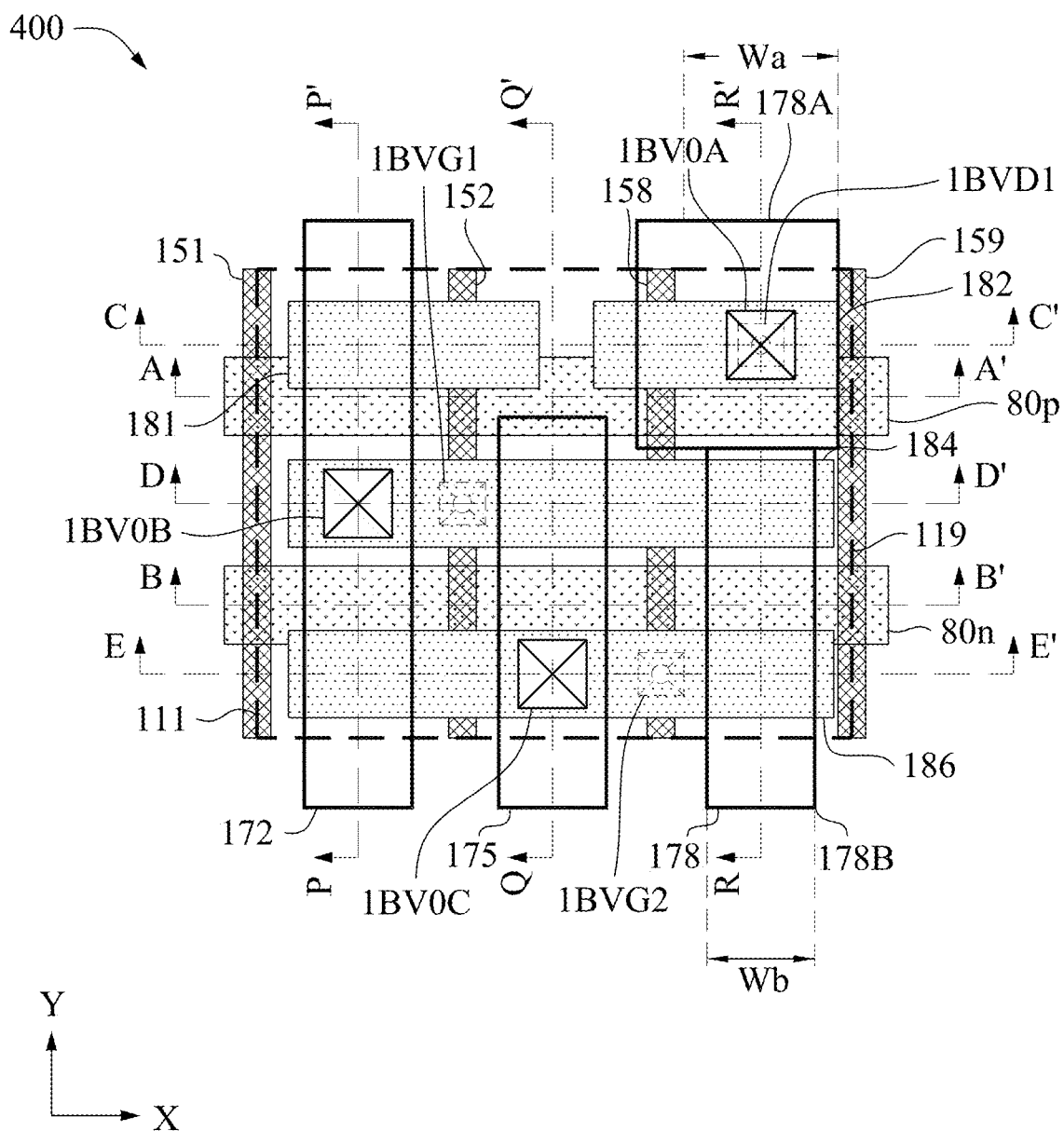

In some embodiments, such as in the NOR gate circuit 400 of FIG. 4E, while the backside vertical conducting line 178 does not extend across the vertical cell boundary 119, the first width "Wa" of the first portion 178A is increased, to provide more flexibility for the positioning of the pin-connector (i.e., the via-connector 1BV0A) onto the backside horizontal conducting line 182. In addition, the backside vertical conducting line 175 (which is adjacent to the backside vertical conducting line 178) is also modified, to avoid design rule violations.

Figure 5A:
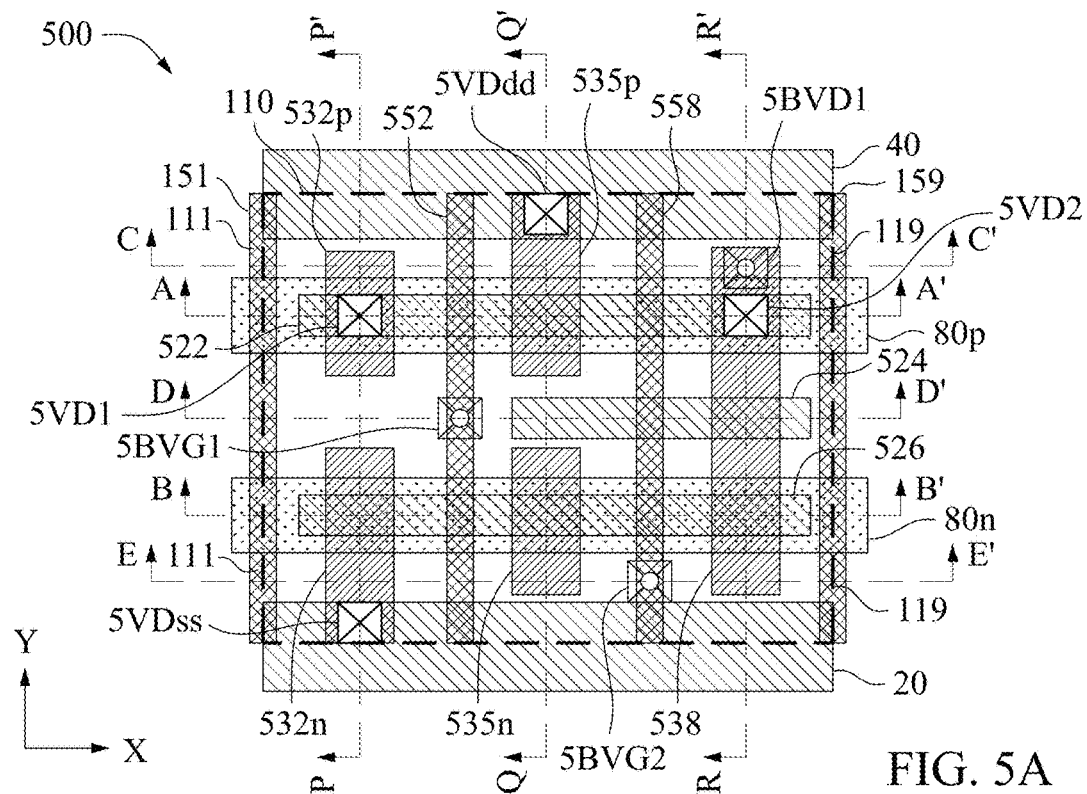
FIGS. 5A-5B are layout diagrams of a NAND gate circuit, in accordance with some embodiments.
Figure 5B:
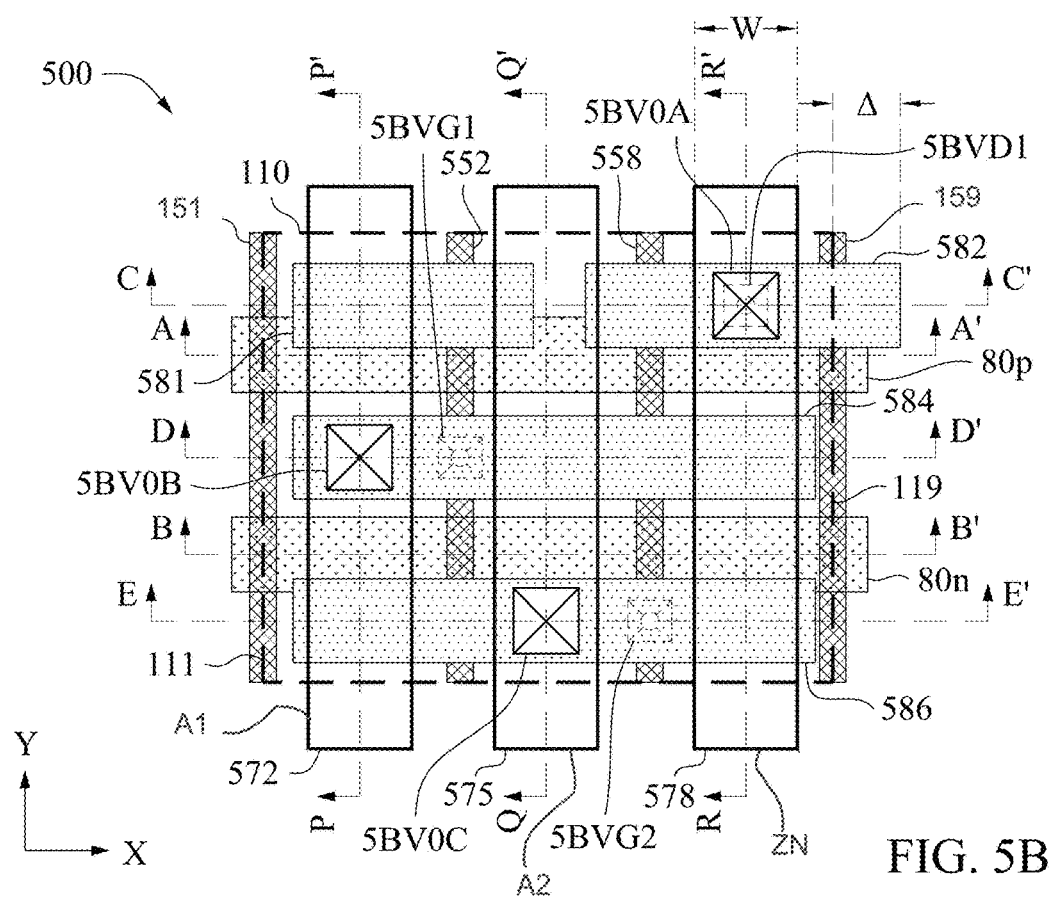

FIGS. 5A-5B are layout diagrams of a NAND gate circuit 500, in accordance with some embodiments. The layout diagrams of FIGS. 5A-5B include the layout patterns for specifying a p-type active-region structure 80$p$ and an n-type active-region structure 80$n$, gate-conductors (552 and 558), terminal-conductors (532$p$, 532$n$, 535$p$, 535$n$, and 538), and dummy gate-conductors (151 and 159). The NAND gate circuit 500 is in a cell that is bounded by cell boundaries 110, and the cell width is bounded by two vertical cell boundaries 111 and 119. The layout diagram of FIG. 5A also includes the layout patterns for specifying the power rails (40 and 20), the front-side first-layer conducting lines (522, 524, and 526), and various via-connectors. The layout diagram of FIG. 5B also includes the layout patterns for specifying the backside horizontal conducting lines (581, 582, 584, and 586), the backside vertical conducting lines (572, 575, and 578), and various via-connectors.

In the NAND gate circuit 500 as specified by the layout diagrams of FIGS. 5A-5B, the gate-conductor 552 intersects the p-type active-region structure 80$p$ at the channel region of a p-type transistor pA1, and intersects the n-type active-region structure 80$n$ at the channel region of an n-type transistor nA1. The gate-conductor 558 intersects the p-type active-region structure 80$p$ at the channel region of a p-type transistor pA2, and intersects the n-type active-region structure 80$n$ at the channel region of an n-type transistor nA2. The terminal-conductors 532$p$ and 535$p$ intersect the p-type active-region structure 80$p$ at various source/drain regions of the p-type transistor pA2 and pA1. The terminal-conductors 532$n$ and 535$n$ intersect the n-type active-region structure 80$n$ at various source/drain regions of the n-type transistor nA2 and nA1. The terminal-conductor 538 intersect the p-type active-region structure 80$p$ and the n-type active-region structure 80$n$ correspondingly at the drain region of the p-type transistor pA1 and at the drain region of the n-type transistor nA1.

In the NAND gate circuit 500 as specified by the layout diagrams of FIGS. 5A-5B, the front-side first-layer conducting lines (522, 524, and 526) and the power rails (40 and 20) are positioned in a first connection layer above the substrate. In the NAND gate circuit 500, the terminal-conductor 535$p$ is conductively connected to the power rail 40 through the via-connector 5VDdd, and the power rail 40 is configured for providing a first supply voltage VDD. The terminal-conductor 532$n$ is conductively connected to the power rail 20 through the via-connector 5VDss, and the power rail 20 is configured for providing a second supply voltage VSS. The front-side first-layer conducting line 522 is conductively connected to the terminal-conductor 532$p$ through the via-connector 5VD1 and conductively connected to the terminal-conductor 538 through the via-connector 5VD2.

In the NAND gate circuit 500, the terminal-conductor 538 (in FIG. 5A) is also conductively connected to the backside horizontal conducting line 582 (in FIG. 5B) through the via-connector 5BVD1 that passes through the substrate. Additionally, the gate-conductor 552 (in FIG. 5A) is conductively connected to the backside horizontal conducting line 584 (in FIG. 5B) through the via-connector 5BVG1, and the gate-conductor 558 (in FIG. 5A) is conductively connected to the backside horizontal conducting line 586 (in FIG. 5B) through the via-connector 5BVG2.

In the NAND gate circuit 500, the backside horizontal conducting line 582 is conductively connected to the backside vertical conducting line 578 through the via-connector 5BV0A. The backside horizontal conducting line 584 is conductively connected to the backside vertical conducting line 572 through the via-connector 5BV0B. The backside horizontal conducting line 586 is conductively connected to the backside vertical conducting line 575 through the via-connector 5BV0C. In the NAND gate circuit 500, the backside horizontal conducting lines 581, 582, 584, and 586 are in a backside first conducting layer below the substrate. The backside vertical conducting lines 572, 575, and 578 are in a backside second conducting layer below the backside first conducting layer and the substrate 50.

In the NAND gate circuit 500, the backside vertical conducting line 572, the via-connector 5BV0B, and the backside horizontal conducting line 584 are conductively connected together to carry an input signal "A1" of the NAND gate circuit 500. The backside vertical conducting line 575, the via-connector 5BV0C, and the backside horizontal conducting line 586 are conductively connected together to carry an input signal "A2" of the NAND gate circuit 500. The backside vertical conducting line 578, the via-connector 5BV0A, and the backside horizontal conducting line 582 are conductively connected together to carry an output signal "ZN" of the NAND gate circuit 500.

In the NAND gate circuit 500, the via-connector 5BV0A functions as a pin-connector extending in the Z-direction for connecting the backside vertical conducting line 578 to the backside horizontal conducting line 582 that carries the output signal "ZN" of the NAND gate circuit 500. In some embodiments, when the backside horizontal conducting line 582 extends across the vertical cell boundary 119, more flexibility is provided for the positioning of the pin-connector (i.e., the via-connector 5BV0A) without generating design rule violations. In FIG. 5B, the backside horizontal conducting line 582 extends across the vertical cell boundary 119 by a distance "Δ" along the X-direction. In some embodiments, the backside horizontal conducting line 582 extends across the vertical cell boundary 119 by a distance "Δ" that is less than one CPP. In some embodiments, the backside horizontal conducting line 582 extends across the vertical cell boundary 119 by a distance "Δ" that is more than one eighth of the CPP, one fourth of the CPP, or one half of the CPP. . In some embodiments, the distance "Δ" is selected to be sufficiently large to mitigate the design rule violations associated with the pin-connector connection between the backside vertical conducting line 578 and the backside horizontal conducting line 582. In some embodiments, the distance "Δ" is selected to be less than one CPP so that the horizontal gap distance from the vertical cell boundary 119 to the vertical cell boundary of the adjacent cell is reduced to a minimal distance for mitigating the design rule violations associated with the pin-connector connection.

Figure 6A:
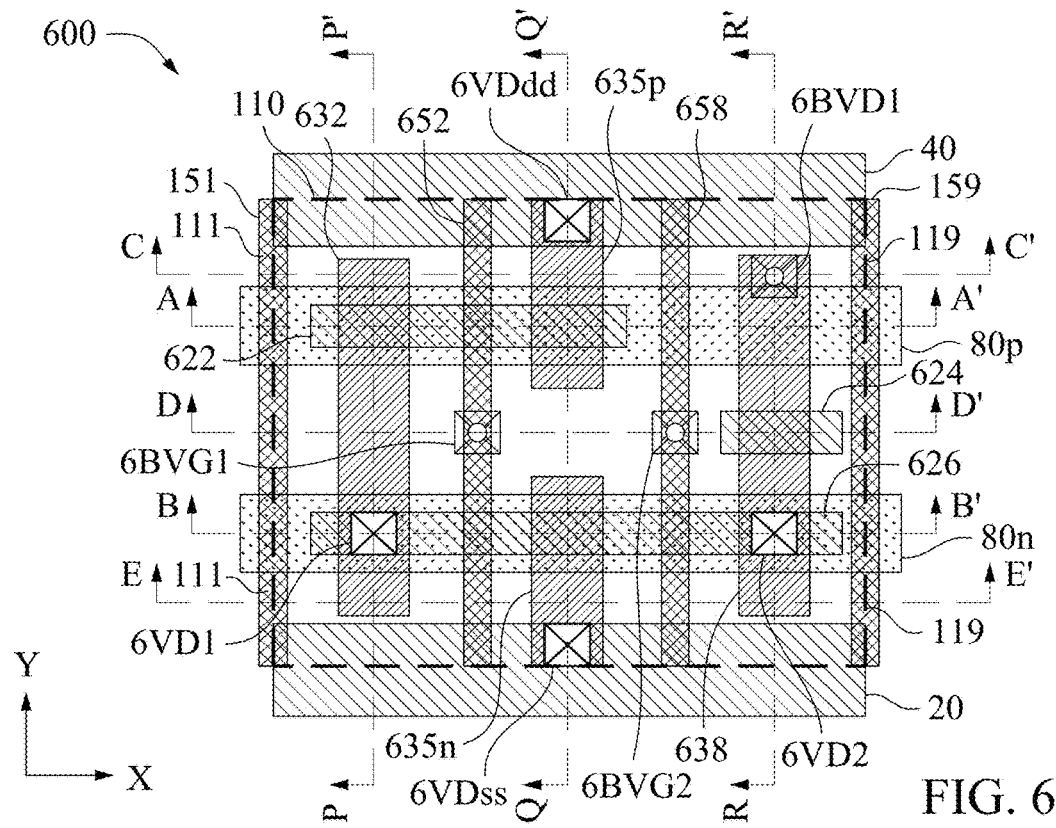
FIGS. 6A-6B are layout diagrams of an inverter circuit, in accordance with some embodiments.
Figure 6B:
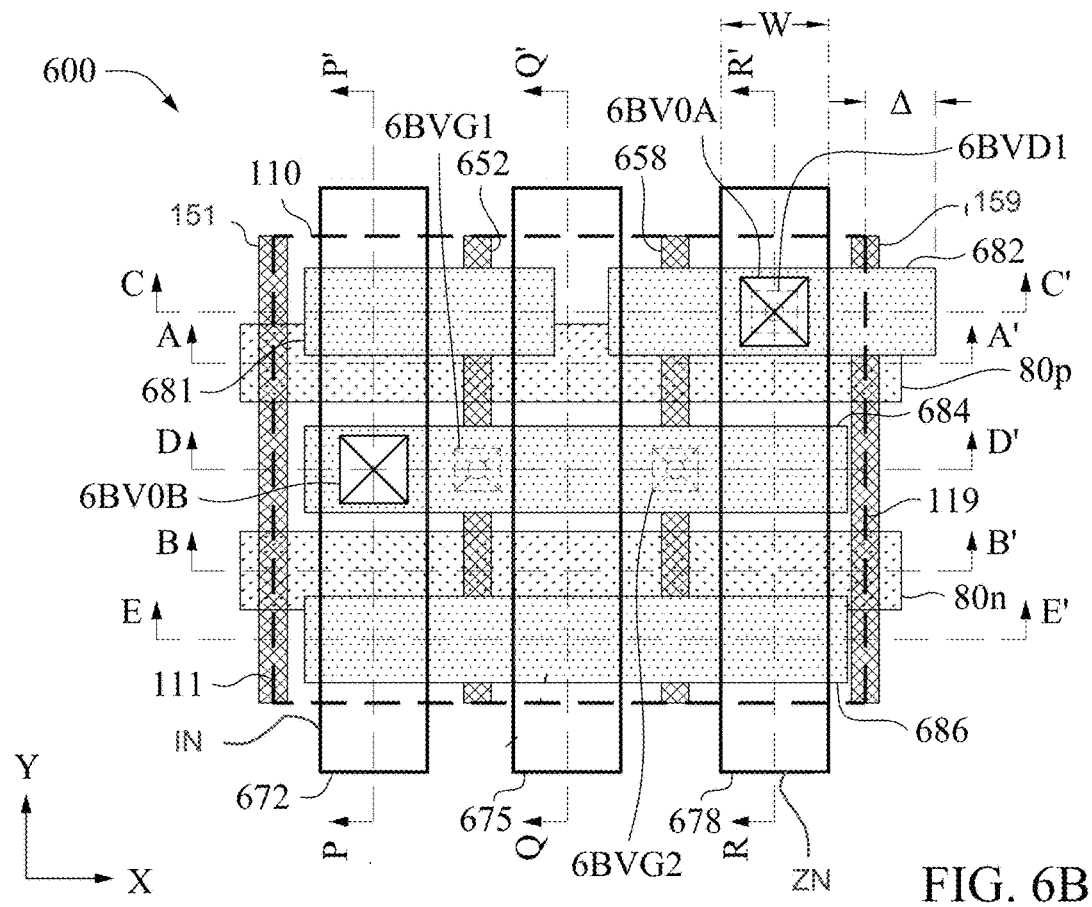

FIGS. 6A-6B are layout diagrams of an inverter circuit 600, in accordance with some embodiments. The layout diagrams of FIGS. 6A-6B include the layout patterns for specifying a p-type active-region structure 80*p* and an n-type active-region structure 80*n*, gate-conductors (652 and 658), terminal-conductors (632, 635*p*, 635*n*, and 638), and dummy gate-conductors (151 and 159). The inverter circuit 600 is in a cell that is bounded by cell boundaries 110, and the cell width is bounded by two vertical cell boundaries 111 and 119. The layout diagram of FIG. 6A also includes the layout patterns for specifying the power rails (40 and 20), the front-side first-layer conducting lines (622, 624, and 626), and various via-connectors. The layout diagram of FIG. 6B also includes the layout patterns for specifying the backside horizontal conducting lines (681, 682, 684, and 686), the backside vertical conducting lines (672, 675, and 678), and various via-connectors.

In the inverter circuit 600 as specified by the layout diagrams of FIGS. 6A-6B, the gate-conductor 652 intersects the p-type active-region structure 80*p* at the channel region of a p-type transistor pA1, and intersects the n-type active-region structure 80*n* at the channel region of an n-type transistor nA1. The gate-conductor 658 intersects the p-type active-region structure 80*p* at the channel region of a p-type transistor pA2, and intersects the n-type active-region structure 80*n* at the channel region of an n-type transistor nA2. The terminal-conductor 635*p* intersects the p-type active-region structure 80*p* at the source regions of the p-type transistor pA2 and pA1. The terminal-conductor 635*n* intersects the n-type active-region structure 80*n* at the source regions of the n-type transistor nA2 and nA1. The terminal-conductors 632 intersects the p-type active-region structure 80*p* and the n-type active-region structure 80*n* correspondingly at the drain region of the p-type transistor pA1 and at the drain region of the n-type transistor nA1. The terminal-conductor 638 intersects the p-type active-region structure 80*p* and the n-type active-region structure 80*n* correspondingly at the drain region of the p-type transistor pA2 and at the drain region of the n-type transistor nA2.

In the inverter circuit 600 as specified by the layout diagrams of FIGS. 6A-6B, the front-side first-layer conducting lines (622, 624, and 626) and the power rails (40 and 20) are positioned in a first connection layer above the substrate. In the inverter circuit 600, the terminal-conductor 635*p* is conductively connected to the power rail 40 through the via-connector 6VDdd, and the power rail 40 is configured for providing a first supply voltage VDD. The terminal-conductor 635*n* is conductively connected to the power rail 20 through the via-connector 6VDss, and the power rail 20 is configured for providing a second supply voltage VSS. The front-side first-layer conducting line 626 is conductively connected to the terminal-conductor 632 through the via-connector 6VD1 and conductively connected to the terminal-conductor 638 through the via-connector 6VD2.

In the inverter circuit 600, the terminal-conductor 638 (in FIG. 6A) is also conductively connected to the backside horizontal conducting line 682 (in FIG. 6B) through the via-connector 6BVD1 that passes through the substrate. Additionally, the backside horizontal conducting line 684 (in FIG. 6B) is conductively connected to the gate-conductor 652 through the via-connector 6BVG1, and conductively connected to the gate-conductor 658 through the via-connector 6BVG2.

In the inverter circuit 600, the backside horizontal conducting line 682 is conductively connected to the backside vertical conducting line 678 through the via-connector 6BV0A. The backside horizontal conducting line 684 is conductively connected to the backside vertical conducting line 672 through the via-connector 6BV0B. In the inverter circuit 600, the backside horizontal conducting lines 681, 682, 684, and 686 are in a backside first conducting layer below the substrate. The backside vertical conducting lines 672, 675, and 678 are in a backside second conducting layer below the backside first conducting layer. In the inverter circuit 600, the backside vertical conducting line 672 functions as an input node "IN" for the inverter circuit 600. The backside vertical conducting line 678 functions as an output node "ZN" for the inverter circuit 600.

In the inverter circuit 600, the via-connector 6BV0A functions as a pin-connector extending in the Z-direction for connecting the backside vertical conducting line 678 to the backside horizontal conducting line 682 that carries the output signal "ZN" of the inverter circuit 600. In some embodiments, when the backside horizontal conducting line 682 extends across the vertical cell boundary 119, more flexibility is provided for the positioning of the pin-connector (i.e., the via-connector 6BV0A) without generating design rule violations. In FIG. 6B, the backside horizontal conducting line 682 extends across the vertical cell boundary 119 by a distance "Δ" extending in the X-direction. In some embodiments, the backside horizontal conducting line 682 extends across the vertical cell boundary 119 by a distance "Δ" that is less than one CPP. In some embodiments, the backside horizontal conducting line 682 extends across the vertical cell boundary 119 by a distance "Δ" that is more than one eighth of the CPP, one fourth of the CPP, or one half of the CPP. In some embodiments, the distance "Δ" is selected to be sufficiently large to mitigate the design rule violations associated with the pin-connector connection between the backside vertical conducting line 678 and the backside horizontal conducting line 682. In some embodiments, the distance "Δ" is selected to be less than one CPP so that the horizontal gap distance from the vertical cell boundary 119 to the vertical cell boundary of the adjacent cell is reduced to a minimal distance for mitigating the design rule violations associated with the pin-connector connection.

Figure 7A:
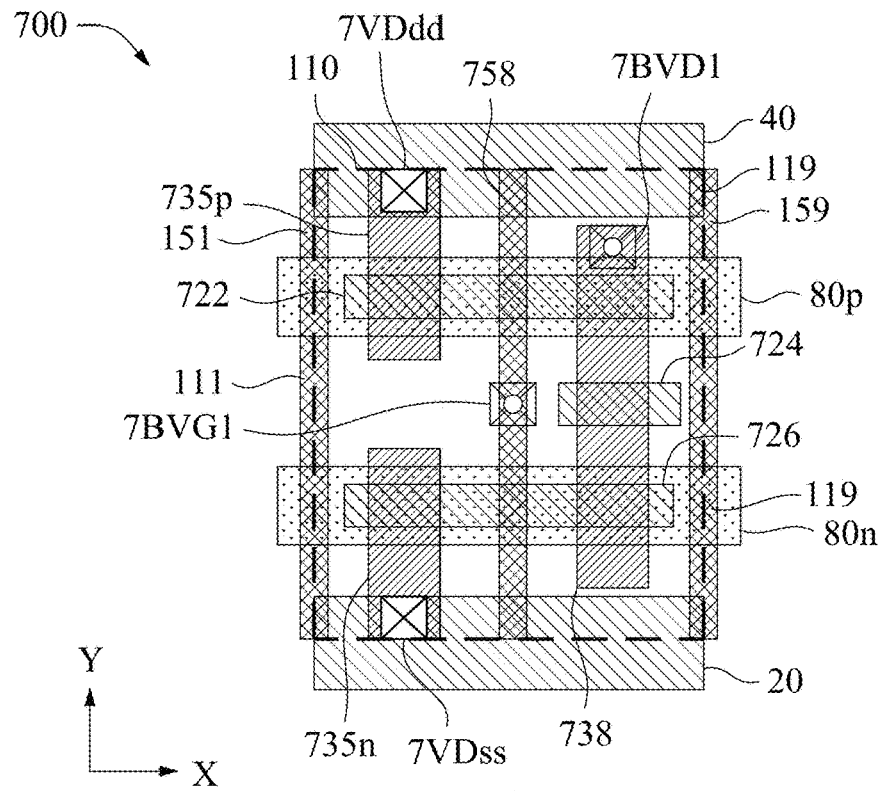
FIGS. 7A-7B are layout diagrams of an inverter circuit, in accordance with some embodiments.
Figure 7B:
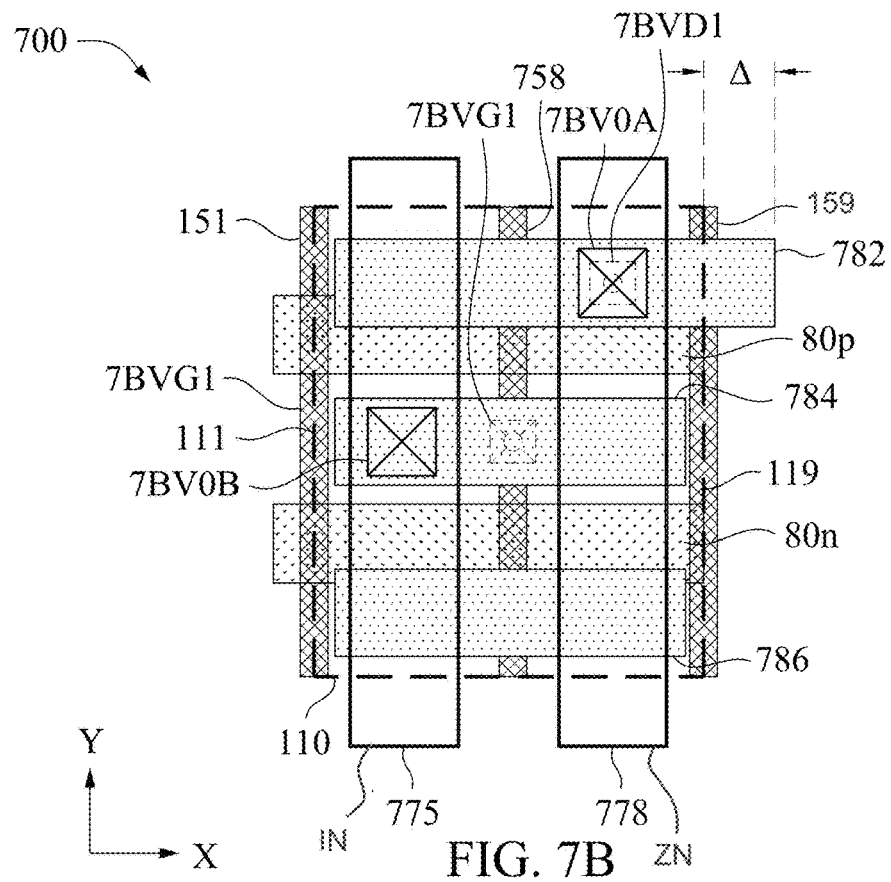

FIGS. 7A-7B are layout diagrams of an inverter circuit 700, in accordance with some embodiments. The layout diagrams of FIGS. 7A-7B include the layout patterns for specifying a p-type active-region structure 80p and an n-type active-region structure 80n, gate-conductor 758, terminal-conductors (735p, 735n, and 738), and dummy gate-conductors (151 and 159). The inverter circuit 700 is in a cell that is bounded by cell boundaries 110, and the cell width is bounded by two vertical cell boundaries 111 and 119. The layout diagram of FIG. 7A also includes the layout patterns for specifying the power rails (40 and 20), the front-side first-layer conducting lines (722, 724, and 726), and various via-connectors. The layout diagram of FIG. 7B also includes the layout patterns for specifying the backside horizontal conducting lines (782, 784, and 786), the backside vertical conducting lines (775, and 778), and various via-connectors.

In the inverter circuit 700 as specified by the layout diagrams of FIGS. 7A-7B, the gate-conductor 758 intersects the p-type active-region structure 80p at the channel region of a p-type transistor Tp, and intersects the n-type active-region structure 80n at the channel region of an n-type transistor Tn. The terminal-conductor 735p intersects the p-type active-region structure 80p at the source region of the p-type transistor Tp. The terminal-conductor 735n intersects the n-type active-region structure 80n at the source region of the n-type transistor Tn. The terminal-conductor 738 intersects the p-type active-region structure 80p and the n-type active-region structure 80n correspondingly at the drain region of the p-type transistor Tp and at the drain region of the n-type transistor Tn.

In the inverter circuit 700 as specified by the layout diagrams of FIGS. 7A-7B, the front-side first-layer conducting lines (722, 724, and 726) and the power rails (40 and 20) are positioned in a first connection layer above the substrate. In the inverter circuit 700, the terminal-conductor 735p is conductively connected to the power rail 40 through the via-connector 7VDdd, and the power rail 40 is configured for supplying a first supply voltage VDD. The terminal-conductor 735n is conductively connected to the power rail 20 through the via-connector 7VDss, and the power rail 20 is configured for supplying a second supply voltage VSS.

In the inverter circuit 700, the terminal-conductor 738 (in FIG. 7A) is also conductively connected to the backside horizontal conducting line 782 (in FIG. 7B) through the via-connector 7BVD1 that passes through the substrate. Additionally, the gate-conductor 758 is conductively connected to the backside horizontal conducting line 784 through the via-connector 7BVG1.

In the inverter circuit 700, the backside horizontal conducting line 782 is conductively connected to the backside vertical conducting line 778 through the via-connector 7BV0A. The backside horizontal conducting line 784 is conductively connected to the backside vertical conducting line 775 through the via-connector 7BV0B. In the inverter circuit 700, the backside horizontal conducting lines 782, 784, and 786 are in a backside first conducting layer below the substrate. The backside vertical conducting lines 772, 775, and 778 are in a backside second conducting layer that is below the backside first conducting layer. In the inverter circuit 700, the backside vertical conducting line 775 functions as an input node "IN" for the inverter circuit 700. The backside vertical conducting line 778 functions as an output node "ZN" for the inverter circuit 700.

In the inverter circuit 700, the via-connector 7BV0A functions as a pin-connector extending in the Z-direction for connecting the backside vertical conducting line 778 to the backside horizontal conducting line 782 that carries the output signal "ZN" of the inverter circuit 700. In some embodiments, when the backside horizontal conducting line 782 extends across the vertical cell boundary 119, more flexibility is provided for the positioning of the pin-connector (i.e., the via-connector 7BV0A) without generating design rule violations. In some embodiments, the flexibility of positioning pin-connectors for circuit cells having cell widths less than or equal to two CPPs improve the layout area coverages in integrated circuit designs. In FIG. 7B, the backside horizontal conducting line 782 extends across the vertical cell boundary 119 by a distance "Δ" extending in the X-direction. In some embodiments, the backside horizontal conducting line 782 extends across the vertical cell boundary 119 by a distance "Δ" that is less than one CPP. In some embodiments, the backside horizontal conducting line 782 extends across the vertical cell boundary 119 by a distance "Δ" that is more than one eighth of the CPP, one fourth of the CPP, or one half of the CPP. In some embodiments, the distance "Δ" is selected to be sufficiently large to mitigate the design rule violations associated with the pin-connector connection between the backside vertical conducting line 778 and the backside horizontal conducting line 782. In some embodiments, the distance "Δ" is selected to be less than one CPP so that the horizontal gap distance from the vertical cell boundary 119 to the vertical cell boundary of the adjacent cell is reduced to a minimal distance for mitigating the design rule violations associated with the pin-connector connection.

Figure 8:
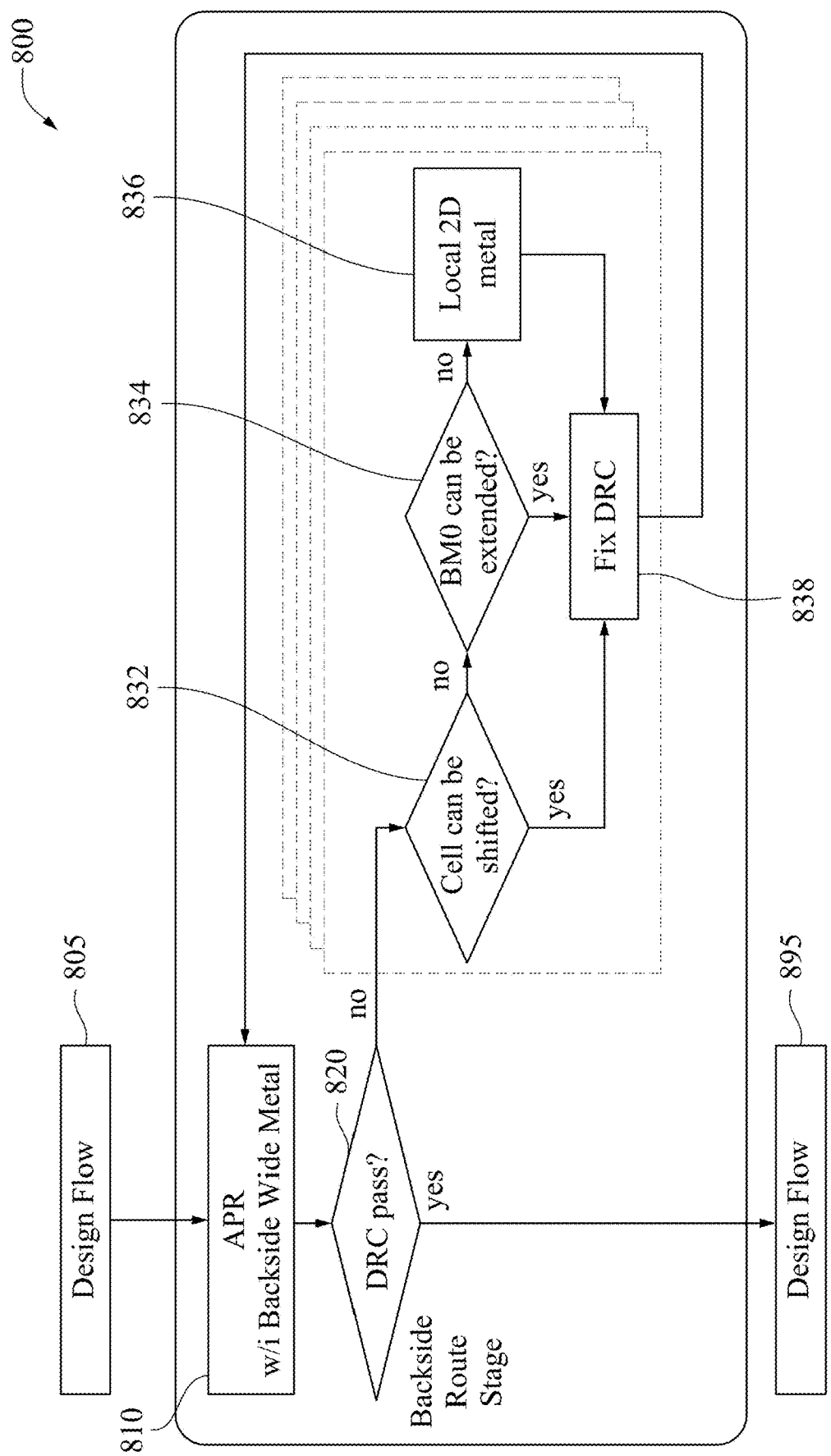
FIG. 8 is a flow chart of a process of designing an integrated circuit, in accordance with some embodiments.
Figure 9A:
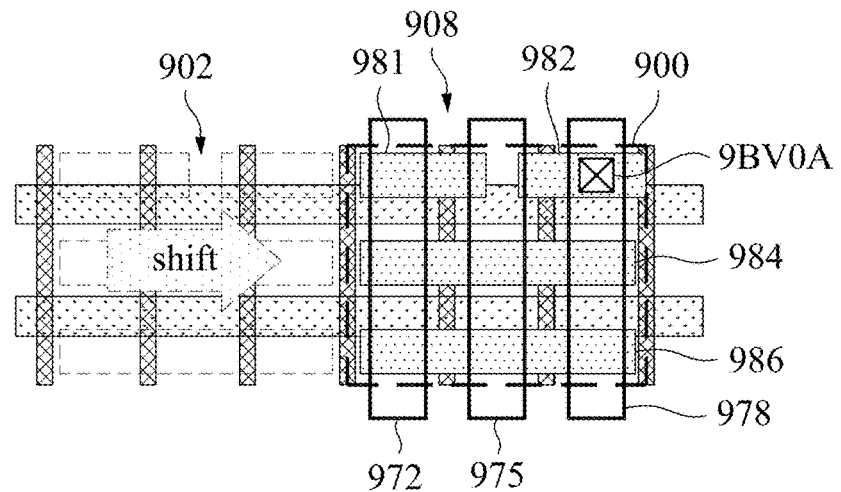
FIGS. 9A-9C are layout diagrams of a cell, in accordance with some embodiments.
Figure 9B:
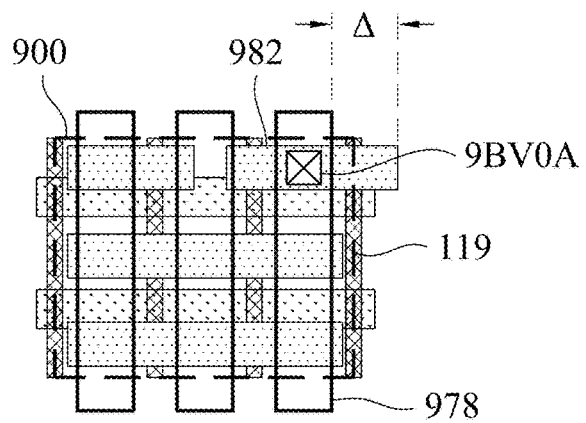
Figure 9C:
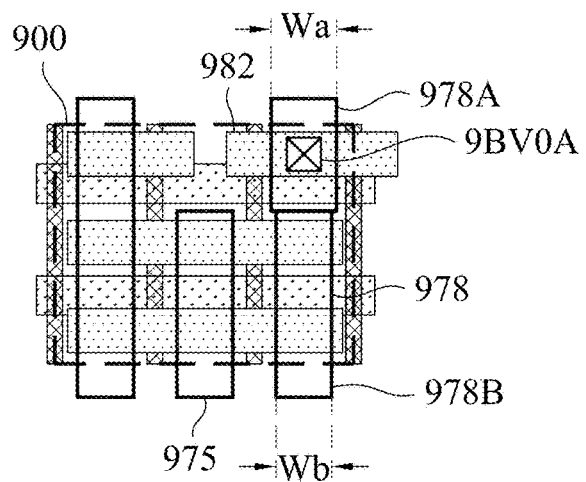

FIG. 8 is a flow chart of a process 800 of designing an integrated circuit, in accordance with some embodiments. The process 800 in FIG. 8 is explained with reference to the layout diagrams in FIGS. 9A-9C as examples. FIGS. 9A-9C are layout diagrams of a cell 900, in accordance with some embodiments. As shown in FIGS. 9A-9C, the cell 900 includes backside horizontal conducting lines (981, 982, 984, and 986) in the first backside metal layer BM0 and backside vertical conducting lines (972, 975, and 978) in the second backside metal layer BM1. The via-connector 9BV0A (which functions as a pin-connector) connects the backside vertical conducting line 978 to the backside horizontal conducting line 982.

In FIG. 8, the process 800 start with the first part 805 of the design flow. The first part 805 includes the design operations before the placement and routing of backside conducting lines. Example operations in the first part 805 of the design flow include floor planning, partitioning, power planning, and placement and routing of various elements at the front side of the substrate. After the process 800 finishes the first part 805 of the design flow, the process 800 proceeds to operation 810 which conducts auto placement and routing (APR) for various backside conducting lines. Then, after operation 810, the process 800 proceeds to operation 820 which conducts a design rule check (DRC) for the layout designs of the backside conducting lines. A design rule for layout designs is a geometric constraint imposed on the layout designs to ensure the corresponding circuits based on the layout designs function properly and reliably and the corresponding circuits can also be produced with acceptable yield. The design rule check is conducted to ensure that the layout designs do not violate design rules. If the layout designs of the backside conducting lines pass the design rule check, the process 800 proceeds to the remaining part 895 of the design flow. On the other hand, if the layout designs of the backside conducting lines fail to pass the design rule check, the process 800 proceeds to operation 832. One example DRC failure is when the separation spacing between two backside conducting lines becomes too small. Another example DRC failure is when a pin-connector is positioned too close to an edge of a backside conducting line.

In operation 832, the layout areas near the cell 900 (which is found to have at least one design rule violation at operation 820) are analyzed to determine whether the positon of the cell 900 can be shifted. If the positon of the cell 900 can be shifted, then the process 800 proceeds to operation 838 to fix design rule violations, and the positon of the cell 900 is shifted from an original position to an alternative position in a modified layout design. For example, in the modified layout design as shown in FIG. 9A, the cell 900 is shifted from the original position 902 to the alternative position 908. On the other hand, in operation 832, if the position of the cell 900 cannot be shifted, the process 800 proceeds to operation 834.

In operation 834, the layout areas near the cell 900 (which are found to have at least one design rule violation at operation 820) are analyzed to determine whether the backside horizontal conducting line for supporting pin access can be extended. If the backside horizontal conducting line can be extended, then the process 800 proceeds to operation 838 to fix design rule violations, and the backside horizontal conducting line is redesigned as an extended conducting line that is extended across a vertical cell boundary in a modified layout design. For example, in the modified layout design as shown in FIG. 9B, the backside horizontal conducting line 982 (as an extended conducting line) extends across the vertical cell boundary 119 by a distance "Δ." On the other hand, in operation 834, if the backside horizontal conducting line for supporting pin access cannot be extended, the process 800 proceeds to operation 836.

In operation 836, the backside vertical conducting line for accessing a circuit node through a pin-connector is redesigned as a local two-dimensional conducting line in a modified layout design, and the process 800 proceeds to operation 838. The local two- dimensional conducting line has a first portion with a first width and has a second portion with a second width that is different from the first width. For example, in the modified layout design as shown in FIG. 9C, the backside vertical conducting line 978 has a first portion 978A and a second portion 978B. The first portion 978A has a first width "Wa," and the second portion 978B has a second width "Wb" which is smaller than the first width "Wa." Additionally, in the modified layout design as shown in FIG. 9C, the backside vertical conducting line 975 is also modified. In some embodiments, the backside vertical conducting line 975 is modified to avoid design rule violations caused by the increased first width "Wa" of the first portion 978A. In some alternative embodiments, the backside vertical conducting line 975 is not modified, while the first portion 978A is designed with an increased first width "Wa." In operation 836, when the backside vertical conducting line (such as 978 in FIG. 9C) for accessing a circuit node is redesigned as a local two-dimensional conducting line, there is the possibility that the local two-dimensional conducting line may cause design rule violations and the adjacent backside vertical conducting line (such as 975 in FIG. 9C) may need to be modified to mitigate the design rule violations. For example, when the backside vertical conducting line 978 is changed to a local two-dimensional conducting line in FIG. 9C, the backside vertical conducting line 975 in FIG. 9C is shortened from the backside vertical conducting line 975 in FIG. 9A. In the example flow chart of FIG. 8, because of the possibility of modifying an adjacent backside vertical conducting line, operation 836 is positioned in the process flow after operations 832 and 834.

In FIG. 8, after the process 800 finishes operation 838, the process 800 returns to operation 810, and auto placement and routing (APR) are conducted for various backside conducting lines. Then, the process 800 proceeds to operation 820, and the modified layout designs are checked again for design rule violations. The iteration including operations 838, 810, and 820 is repeated until the layout design passes the design rule check, then, the process 800 proceeds to the remaining part 895 of the design flow. Example operations in the remaining part 895 of the design flow include clock tree synthesis, RC extraction, timing analysis, signal integrity analysis, verifications, and the like.

Figure 10:
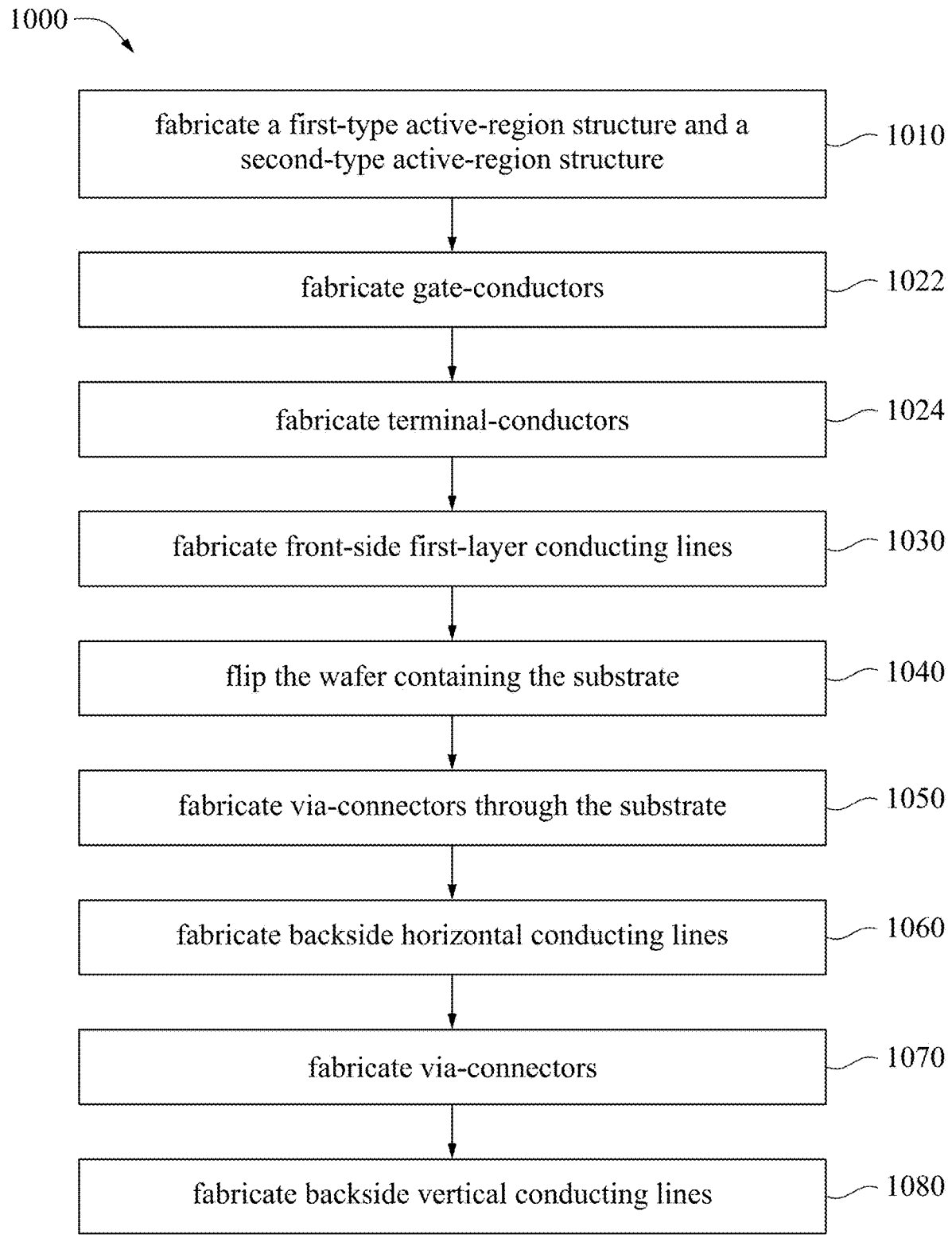
FIG. 10 is a flowchart of a method of manufacturing an integrated circuit, in accordance with some embodiments.

FIG. 10 is a flowchart of a method 1000 of manufacturing an integrated circuit, in accordance with some embodiments. The sequence in which the operations of method 1000 are depicted in FIG. 10 is for illustration only; the operations of method 1000 are capable of being executed in sequences that differ from that depicted in FIG. 10. It is understood that additional operations may be performed before, during, and/or after the method 1000 depicted in FIG. 10, and that some other processes may only be briefly described herein.

In operation 1010 of method 1000, a first-type active-region structure and a second-type active-region structure are fabricated. In some embodiments, the first-type active-region structure is a p-type active-region structure, and the second-type active-region structure an n-type active-region structure. In some embodiments, the first-type active-region structure is an n-type active-region structure, and the second-type active-region structure a p-type active-region structure. In the example embodiment as shown in FIGS. 2A-2E and FIGS. 3A-3C, the p-type active-region structure 80p and the n-type active-region structure 80n are fabricated atop the substrate 50. Examples of the active-region structures fabricated in operation 1010 include fin structures, nano-sheet structures, and nano-wire structures.

In operation 1022 and operation 1024 of method 1000, gate-conductors and terminal-conductors are fabricated. Each of the gate-conductor and the terminal-conductors intersects the first-type active-region structure and/or the second-type active-region structure above the substrate. In the example embodiment as shown in FIGS. 2A-2E and FIGS. 3A-3C, the gate-conductors fabricated in operation 1022 include the gate-conductors 152 and 158 intersecting the p-type active-region structure 80p and the n-type active-region structure 80n. In the example embodiment, the terminal-conductors fabricated in operation 1022 include the terminal-conductors 132p, 135p, and 138 intersecting the p-type active-region structure 80p and the terminal-conductors 132n, 135n, and 138 intersecting the n-type active-region structure 80n. After operation 1022 and operation 1024, the process flow proceeds to operation 1030.

In operation 1030 of method 1000, front-side first-layer conducting lines are fabricated. In the example embodiment as shown in FIGS. 2A-2E and FIGS. 3A-3C, after a top insulation layer is fabricated in the front-end-of-line (FEOL) process, the front-side first-layer conducting lines 122, 124, and 126 in a first connection layer (such as the first metal layer M0) overlying the top insulation layer are fabricated in operation 1030.

After operations 1010, 1022, 1024, and 1030, the wafer containing the substrate is flipped in operation 1040. Then, the process flow proceeds to 1050. In operation 1050 of method 1000, via-connectors that pass through the substrate are fabricated. One example of the via-connectors fabricated in operation 1050 is the via-connector for connecting a gate-conductor at the front side of the substrate to a conducting line at the backside of the substrate. Another example of the via-connectors fabricated in operation 1050 is the via-connector for connecting a terminal-conductor at the front side of the substrate to a conducting line at the backside of the substrate. In the example embodiment as shown in FIGS. 2A-2E and FIGS. 3A-3C, the via-connectors 1BVG1, 1BVG2, and 1BVD1 that pass through the substrate 50 are fabricated in operation 1050. After operation 1050, the process flow proceeds to operation 1060.

In operation 1060 of method 1000, backside horizontal conducting lines are fabricated at the backside of the substrate. In some embodiments, one of the backside horizontal conducting lines is fabricated as an extended conducting line that extends across a vertical boundary of a circuit cell by a distance that is less than one CPP. In the example embodiment as shown in FIGS. 2A-2E and FIGS. 3A-3C, the backside horizontal conducting lines 181, 182, 184, and 186 are fabricated in a backside first conducting layer (such as in the first backside metal layer BM0) at the backside of the substrate 50. In the example embodiment, the backside horizontal conducting line 182 extends across the vertical cell boundary 119 by a distance "Δ" that is less than one CPP. After operation 1060, the process flow proceeds to operation 1070.

In operation 1070 of method 1000, via-connectors are fabricated. One example of the via-connectors fabricated in operation 1070 is the via-connector for connecting a backside horizontal conducting line with a backside vertical conducting line. In the example embodiment as shown in FIGS. 2A-2E and FIGS. 3A-3C, the via-connectors 1BV0A, 1BV0B, and 1BV0C which pass through the backside interlayer dielectric 56 are fabricated in operation 1070. After operation 1070, the process flow proceeds to operation 1080.

In operation 1080 of method 1000, backside vertical conducting lines are fabricated. In some embodiments, one of the backside vertical conducting lines is aligned with a vertical boundary of a circuit cell and is directly connected to one of the backside horizontal conducting lines with a pin-connector. In some embodiments, the backside vertical conducting lines that is aligned with the vertical boundary of the circuit cell is a local two-dimensional conducting line which has a first portion with a first width and has a second portion with a second width that is different from the first width. In the example embodiment as shown in FIGS. 2A-2E and FIGS. 3A-3C, the backside vertical conducting lines 172, 175, and 178 are fabricated in a backside first conducting layer (such as in the first backside metal layer BM0). In the example embodiment, the backside vertical conducting line 178 is aligned with the vertical cell boundary 119. The backside vertical conducting line 178 is conductively connected to the backside horizontal conducting line 182 through the via-connector 1BV0A (which functions as a pin-connector). In the example embodiment as shown in FIGS. 4A-4E, the backside vertical conducting line 178 includes a first portion 178A that has a first width "Wa" and a second portion 178B that has a second width "Wb."

In the example embodiment as shown in FIGS. 2A-2E and FIGS. 3A-3C, the gear ratio between the backside vertical conducting lines (in the second backside metal layer BM1) and the contacted poly pitch (CPP) of the gate-conductors is one to one (i.e., 1:1). In some alternative embodiments, the gear ratio between the backside vertical conducting lines (in the second backside metal layer BM1) and the CPP of the gate-conductors is two to three (i.e., 2:3). In still some alternative embodiments, the gear ratio between the backside vertical conducting lines (in the second backside metal layer BM1) and the CPP of the gate-conductors is one to two (i.e., 1:2). Other selections of the gear ratios are also within the contemplated scope of the present disclosure.

Figure 11:
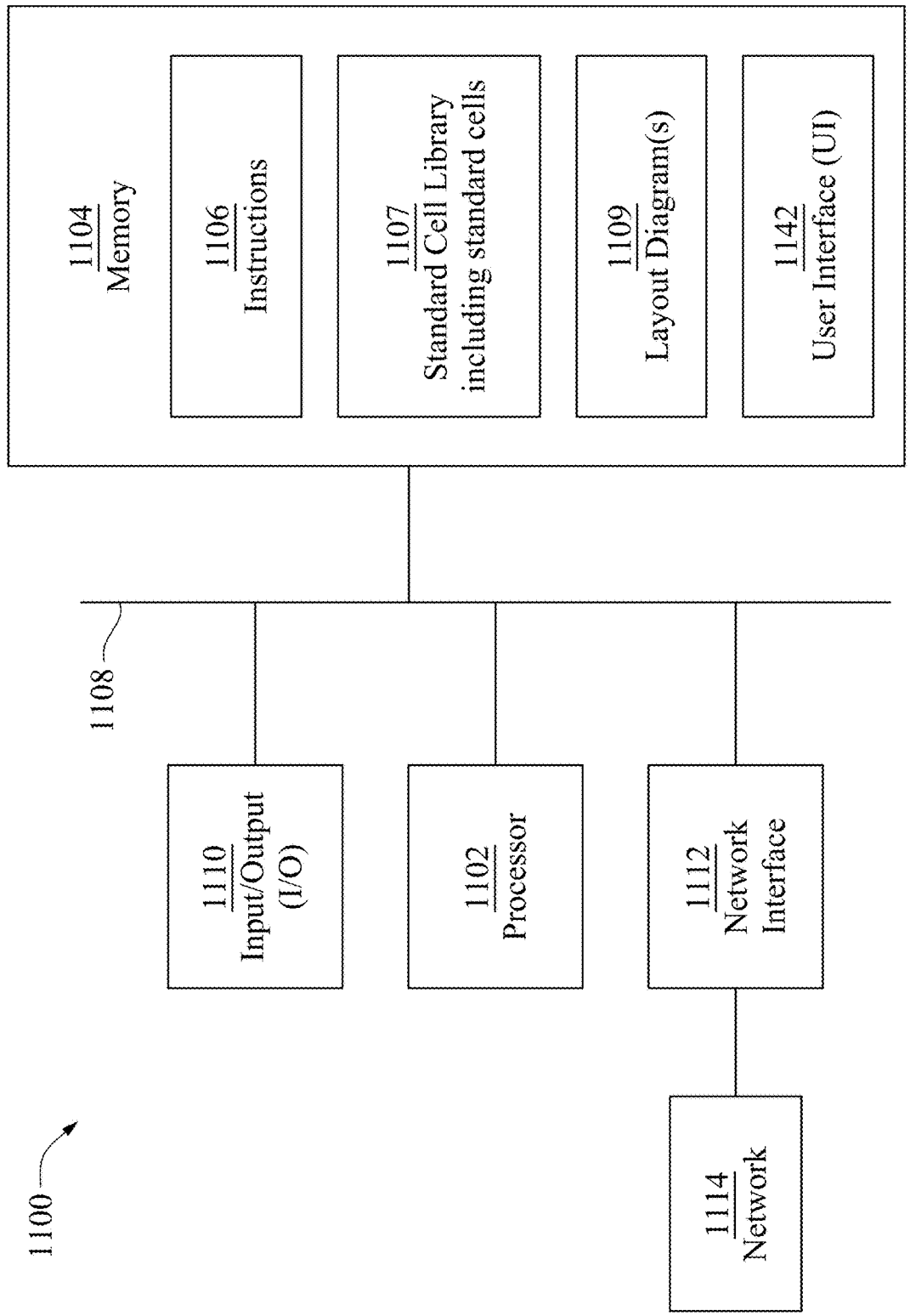
FIG. 11 is a block diagram of an electronic design automation (EDA) system in accordance with some embodiments.

FIG. 11 is a block diagram of an electronic design automation (EDA) system 1100 in accordance with some embodiments.

In some embodiments, EDA system 1100 includes an APR system. Methods described herein of designing layout diagrams represent wire routing arrangements, in accordance with one or more embodiments, are implementable, for example, using EDA system 1100, in accordance with some embodiments.

In some embodiments, EDA system 1100 is a general purpose computing device including a hardware processor 1102 and a non-transitory, computer-readable storage medium 1104. Storage medium 1104, amongst other things, is encoded with, i.e., stores, computer program code 1106, i.e., a set of executable instructions. Execution of instructions 1106 by hardware processor 1102 represents (at least in part) an EDA tool which implements a portion or all of the methods described herein in accordance with one or more embodiments (hereinafter, the noted processes and/or methods).

Processor 1102 is electrically coupled to computer-readable storage medium 1104 via a bus 1108. Processor 1102 is also electrically coupled to an I/O interface 1110 by bus 1108. A network interface 1112 is also electrically connected to processor 1102 via bus 1108. Network interface 1112 is connected to a network 1114, so that processor 1102 and computer-readable storage medium 1104 are capable of connecting to external elements via network 1114. Processor 1102 is configured to execute computer program code 1106 encoded in computer-readable storage medium 1104 in order to cause system 1100 to be usable for performing a portion or all of the noted processes and/or methods. In one or more embodiments, processor 1102 is a central processing unit (CPU), a multi-processor, a distributed processing system, an application specific integrated circuit (ASIC), and/or a suitable processing unit.

In one or more embodiments, computer-readable storage medium 1104 is an electronic, magnetic, optical, electromagnetic, infrared, and/or a semiconductor system (or apparatus or device). For example, computer-readable storage medium 1104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1104 includes a compact disk-read only memory (CD-ROM), a compact disk-read/write (CD-R/W), and/or a digital video disc (DVD).

In one or more embodiments, storage medium 1104 stores computer program code 1106 configured to cause system 1100 (where such execution represents (at least in part) the EDA tool) to be usable for performing a portion or all of the noted processes and/or methods. In one or more embodiments, storage medium 1104 also stores information which facilitates performing a portion or all of the noted processes and/or methods. In one or more embodiments, storage medium 1104 stores library 1107 of standard cells including such standard cells as disclosed herein. In one or more embodiments, storage medium 1104 stores one or more layout diagrams 1109 corresponding to one or more layouts disclosed herein.

EDA system 1100 includes I/O interface 1110. I/O interface 1110 is coupled to external circuitry. In one or more embodiments, I/O interface 1110 includes a keyboard, keypad, mouse, trackball, trackpad, touchscreen, and/or cursor direction keys for communicating information and commands to processor 1102.

EDA system 1100 also includes network interface 1112 coupled to processor 1102. Network interface 1112 allows system 1100 to communicate with network 1114, to which one or more other computer systems are connected. Network interface 1112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1100.

System 1100 is configured to receive information through I/O interface 1110. The information received through I/O interface 1110 includes one or more of instructions, data, design rules, libraries of standard cells, and/or other parameters for processing by processor 1102. The information is transferred to processor 1102 via bus 1108. EDA system 1100 is configured to receive information related to a UI through I/O interface 1110. The information is stored in computer-readable medium 1104 as user interface (UI) 1142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1100. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 12:
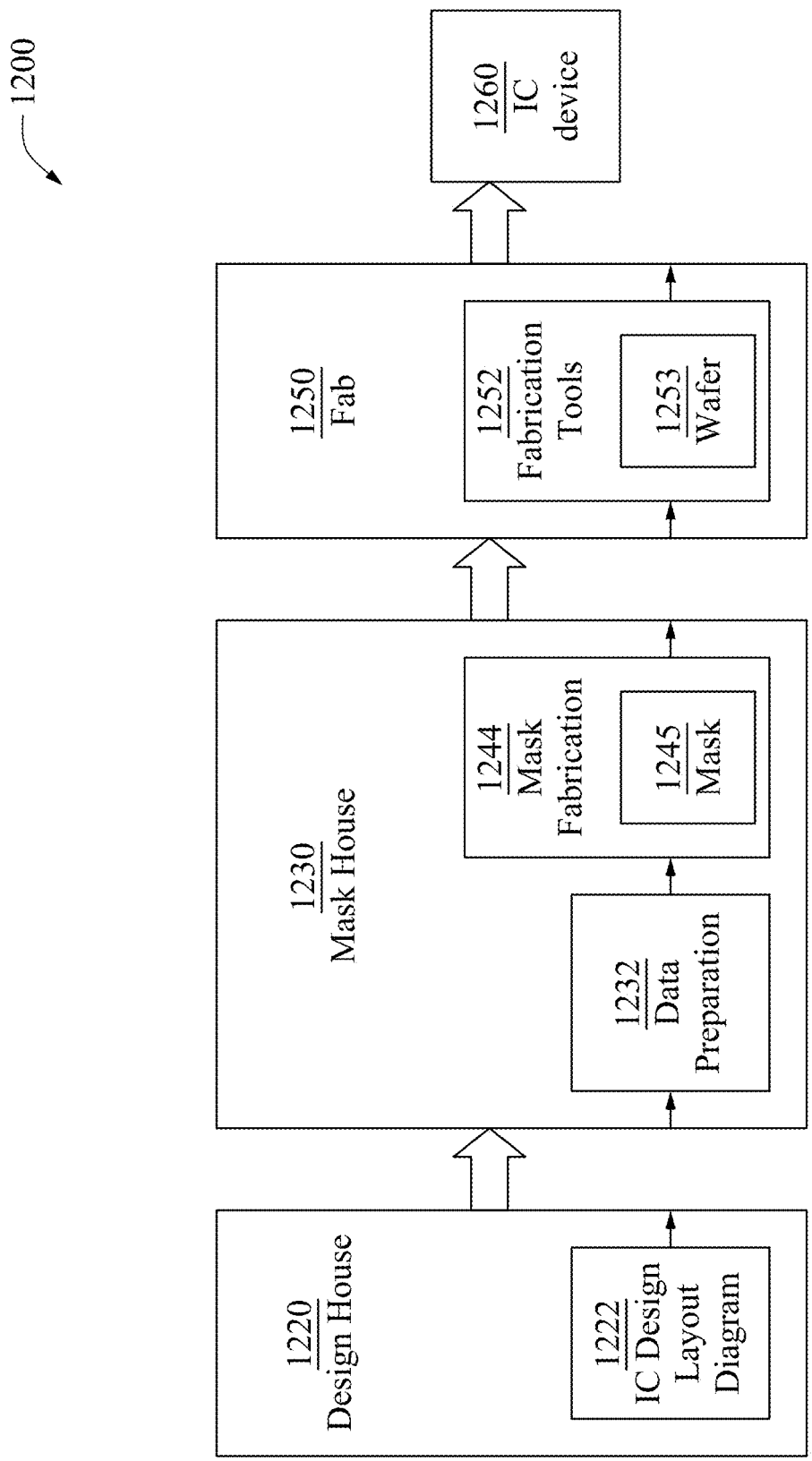
FIG. 12 is a block diagram of an integrated circuit (IC) manufacturing system, and an IC manufacturing flow associated therewith, in accordance with some embodiments.

FIG. 12 is a block diagram of an integrated circuit (IC) manufacturing system 1200, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1200.

In FIG. 12, IC manufacturing system 1200 includes entities, such as a design house 1220, a mask house 1230, and an IC manufacturer/fabricator ("fab") 1250, that interact with one another in the design, development, and manufacturing cycles and/or services related to manufacturing an IC device 1260. The entities in system 1200 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1220, mask house 1230, and IC fab 1250 is owned by a single larger company. In some embodiments, two or more of design house 1220, mask house 1230, and IC fab 1250 coexist in a common facility and use common resources.

Design house (or design team) 1220 generates an IC design layout diagram 1222. IC design layout diagram 1222 includes various geometrical patterns designed for an IC device 1260. The geometrical patterns correspond to patterns of metal, oxide, or semiconductor layers that make up the various components of IC device 1260 to be fabricated. The various layers combine to form various IC features. For example, a portion of IC design layout diagram 1222 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1220 implements a proper design procedure to form IC design layout diagram 1222. The design procedure includes one or more of logic design, physical design or place and route. IC design layout diagram 1222 is presented in one or more data files having information of the geometrical patterns. For example, IC design layout diagram 1222 can be expressed in a GDSII file format or DFII file format.

Mask house 1230 includes data preparation 1232 and mask fabrication 1244. Mask house 1230 uses IC design layout diagram 1222 to manufacture one or more masks 1245 to be used for fabricating the various layers of IC device 1260 according to IC design layout diagram 1222. Mask house 1230 performs mask data preparation 1232, where IC design layout diagram 1222 is translated into a representative data file ("RDF"). Mask data preparation 1232 provides the RDF to mask fabrication 1244. Mask fabrication 1244 includes a mask writer. A mask writer converts the RDF to an image on a substrate, such as a mask (reticle) 1245 or a semiconductor wafer 1253. The design layout diagram 1222 is manipulated by mask data preparation 1232 to comply with particular characteristics of the mask writer and/or requirements of IC fab 1250. In FIG. 12, mask data preparation 1232 and mask fabrication 1244 are illustrated as separate elements. In some embodiments, mask data preparation 1232 and mask fabrication 1244 can be collectively referred to as mask data preparation.

In some embodiments, mask data preparation 1232 includes optical proximity correction (OPC) which uses lithography enhancement techniques to compensate for image errors, such as those that can arise from diffraction, interference, other process effects and the like. OPC adjusts IC design layout diagram 1222. In some embodiments, mask data preparation 1232 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1232 includes a mask rule checker (MRC) that checks the IC design layout diagram 1222 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1222 to compensate for limitations during mask fabrication 1244, which may undo part of the modifications performed by OPC in order to meet mask creation rules.

In some embodiments, mask data preparation 1232 includes lithography process checking (LPC) that simulates processing that will be implemented by IC fab 1250 to fabricate IC device 1260. LPC simulates this processing based on IC design layout diagram 1222 to create a simulated manufactured device, such as IC device 1260. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1222.

It should be understood that the above description of mask data preparation 1232 has been simplified for the purposes of clarity. In some embodiments, data preparation 1232 includes additional features such as a logic operation (LOP) to modify the IC design layout diagram 1222 according to manufacturing rules. Additionally, the processes applied to IC design layout diagram 1222 during data preparation 1232 may be executed in a variety of different orders.

After mask data preparation 1232 and during mask fabrication 1244, a mask 1245 or a group of masks 1245 are fabricated based on the modified IC design layout diagram 1222. In some embodiments, mask fabrication 1244 includes performing one or more lithographic exposures based on IC design layout diagram 1222. In some embodiments, an electron-beam (e-beam) or a mechanism of multiple e-beams is used to form a pattern on a mask (photomask or reticle) 1245 based on the modified IC design layout diagram 1222. Mask 1245 can be formed in various technologies. In some embodiments, mask 1245 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1245 includes a transparent substrate (e.g., fused quartz) and an opaque material (e.g., chromium) coated in the opaque regions of the binary mask. In another example, mask 1245 is formed using a phase shift technology. In a phase shift mask (PSM) version of mask 1245, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1244 is used in a variety of processes. For example, such a mask(s) is used in an ion implantation process to form various doped regions in semiconductor wafer 1253, in an etching process to form various etching regions in semiconductor wafer 1253, and/or in other suitable processes.

IC fab 1250 is an IC fabrication business that includes one or more manufacturing facilities for the fabrication of a variety of different IC products. In some embodiments, IC Fab 1250 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1250 includes fabrication tools 1252 configured to execute various manufacturing operations on semiconductor wafer 1253 such that IC device 1260 is fabricated in accordance with the mask(s), e.g., mask 1245. In various embodiments, fabrication tools 1252 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1250 uses mask(s) 1245 fabricated by mask house 1230 to fabricate IC device 1260. Thus, IC fab 1250 at least indirectly uses IC design layout diagram 1222 to fabricate IC device 1260. In some embodiments, semiconductor wafer 1253 is fabricated by IC fab 1250 using mask(s) 1245 to form IC device 1260. In some embodiments, the IC fabrication includes performing one or more lithographic exposures based at least indirectly on IC design layout diagram 1222. Semiconductor wafer 1253 includes a silicon substrate or other proper substrate having material layers formed thereon. Semiconductor wafer 1253 further includes one or more of various doped regions, dielectric features, multi-level interconnects, and the like (formed at subsequent manufacturing steps).

Details regarding an integrated circuit (IC) manufacturing system (e.g., system 1200 of FIG. 12), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspects of the present disclosure relates to an integrated circuit. The integrated circuit includes a first-type active-region structure and a second-type active-region structure extending in a first direction on a substrate, a front-side first-layer conducting line in a first connection layer above the substrate, and a plurality of gate-conductors extending in a second direction below the first connection layer. Two adjacent gate-conductors are separated by a pitch distance equal to a contacted poly pitch ("CPP"). The integrated circuit also includes a circuit cell having a first vertical boundary and a second vertical boundary extending in the second direction perpendicular to the first direction. Each of the first vertical boundary and the second vertical boundary crosses at least one boundary isolation region, and a distance between the first vertical boundary and the second vertical boundary along the first direction is less than or equal to three CPPs. The integrated circuit also includes a backside horizontal conducting line extending in the first direction in a backside first conducting layer below the substrate, a backside vertical conducting line extending in the second direction in a backside second conducting layer below the backside first conducting layer, and a pin-connector for the circuit cell directly connected between the backside horizontal conducting line and the backside vertical conducting line. The backside horizontal conducting line extends across the first vertical boundary of the circuit cell. The backside vertical conducting line is aligned with the first vertical boundary.

Another aspect of the present disclosure relates an integrated circuit. The integrated circuit includes a first-type active-region structure and a second-type active-region structure extending in a first direction on a substrate, a front-side first-layer conducting line in a first connection layer above the substrate, and a plurality of gate-conductors extending in a second direction below the first connection layer. Two adjacent gate-conductors are separated by a pitch distance equal to a contacted poly pitch ("CPP"). The integrated circuit also includes a circuit cell having a first vertical boundary and a second vertical boundary extending in the second direction perpendicular to the first direction. Each of the first vertical boundary and the second vertical boundary crosses at least one boundary isolation region. The integrated circuit also includes a backside horizontal conducting line extending in the first direction in a backside first conducting layer below the substrate, a backside vertical conducting line extending in the second direction in a backside second conducting layer below the backside first conducting layer, and a pin-connector for the circuit cell directly connected between the backside horizontal conducting line and the backside vertical conducting line at an overlap region between the backside horizontal conducting line and the backside vertical conducting line. The backside vertical conducting line has a first portion covering the overlap region and a second portion outside the overlap region. A first width of the first portion along the first direction is larger than a second width of the second portion along the first direction.

Still another aspect of the present disclosure relates to a method. The method includes fabricating a first-type active-region structure and a second-type active-region structure extending in a first direction on a substrate, and fabricating a plurality of gate-conductors extending in a second direction perpendicular to the first direction. Each gate-conductor intersects the first-type active-region structure and/or the second-type active-region structure above the substrate. Two adjacent gate-conductors are separated by a pitch distance equal to a contacted poly pitch (CPP). The method also includes fabricating a backside horizontal conducting line extending in the first direction in a backside first conducting layer below the substrate, fabricating a pin-connector that is connected to the backside horizontal conducting line, and fabricating a backside vertical conducting line extending in the second direction in a backside second conducting layer below the backside first conducting layer, The backside vertical conducting line is aligned with a first vertical boundary of a circuit cell. The pin-connector is directly connected between the backside horizontal conducting line and the backside vertical conducting line at an overlap region between the backside horizontal conducting line and the backside vertical conducting line. In the method, fabricating the backside horizontal conducting line includes fabricating the backside horizontal conducting line as an extended conducting line that extends across the first vertical boundary of the circuit cell by a distance that is less than one CPP.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
   a first-type active-region structure and a second-type active-region structure extending in a first direction on a substrate;
   a front-side first-layer conducting line in a first connection layer above the substrate;
   a plurality of gate-conductors extending in a second direction below the first connection layer, and wherein two adjacent gate-conductors are separated by a pitch distance equal to a contacted poly pitch ("CPP");
   a circuit cell having a first vertical boundary and a second vertical boundary extending in the second direction perpendicular to the first direction, wherein each of the first vertical boundary and the second vertical boundary crosses at least one boundary isolation region, and wherein a distance between the first vertical boundary and the second vertical boundary along the first direction is less than or equal to three CPPs;
   a backside horizontal conducting line extending in the first direction in a backside first conducting layer below the substrate, wherein the backside horizontal conducting line extends across the first vertical boundary of the circuit cell;
   a backside vertical conducting line extending in the second direction in a backside second conducting layer below the backside first conducting layer, wherein the backside vertical conducting line is aligned with the first vertical boundary; and
   a pin-connector for the circuit cell directly connected between the backside horizontal conducting line and the backside vertical conducting line.

2. The integrated circuit of claim 1, wherein the backside horizontal conducting line extends across the first vertical boundary of the circuit cell by a distance that is less than one CPP but more than one eighth of the CPP.

3. The integrated circuit of claim 1, wherein the backside horizontal conducting line extends across the first vertical boundary of the circuit cell by a distance that is less than one CPP but more than one fourth of the CPP.

4. The integrated circuit of claim 1, wherein the backside horizontal conducting line extends across the first vertical boundary of the circuit cell by a distance that is less than one CPP but more than one half of the CPP.

5. The integrated circuit of claim 1, wherein the backside vertical conducting line has a width along the first direction that is larger than three fourths of the CPP.

6. The integrated circuit of claim 1, wherein the backside vertical conducting line has a width along the first direction that is larger than one half of the CPP.

7. The integrated circuit of claim 1, wherein the distance between the first vertical boundary and the second vertical boundary along the first direction is less than or equal to two CPPs.

8. An integrated circuit comprising:
   a first-type active-region structure and a second-type active-region structure extending in a first direction on a substrate;

a front-side first-layer conducting line in a first connection layer above the substrate;
a plurality of gate-conductors extending in a second direction below the first connection layer, and wherein two adjacent gate-conductors are separated by a pitch distance equal to a contacted poly pitch ("CPP"),
circuit cell having a first vertical boundary and a second vertical boundary extending in the second direction perpendicular to the first direction, wherein each of the first vertical boundary and the second vertical boundary crosses at least one boundary isolation region;
a backside horizontal conducting line extending in the first direction in a backside first conducting layer below the substrate;
a backside vertical conducting line extending in the second direction in a backside second conducting layer below the backside first conducting layer;
a pin-connector for the circuit cell directly connected between the backside horizontal conducting line and the backside vertical conducting line at an overlap region between the backside horizontal conducting line and the backside vertical conducting line; and
wherein the backside vertical conducting line has a first portion covering the overlap region and a second portion outside the overlap region, and wherein a first width of the first portion along the first direction is larger than a second width of the second portion along the first direction.

9. The integrated circuit of claim 8, wherein the first width is larger than the second width by an amount that is more than one eighth of the CPP.

10. The integrated circuit of claim 8, wherein the first width is larger than the second width by an amount that is more than one fourth of the CPP.

11. The integrated circuit of claim 8, wherein the first vertical boundary and the second vertical boundary are separated by a distance along the first direction that is less than or equal to three CPPs.

12. The integrated circuit of claim 8, wherein the first vertical boundary and the second vertical boundary are separated by a distance along the first direction that is less than or equal to two CPPs.

13. The integrated circuit of claim 8, wherein the backside horizontal conducting line extends across the first vertical boundary of the circuit cell by a distance that is less than one CPP but more than one eighth of the CPP.

14. The integrated circuit of claim 8, wherein the backside horizontal conducting line extends across the first vertical boundary of the circuit cell by a distance that is less than one CPP but more than one fourth of the CPP.

15. An integrated circuit comprising:
a first-type active-region structure and a second-type active-region structure extending in a first direction on a substrate;
a front-side first-layer conducting line in a first connection layer above the substrate;
a plurality of gate-conductors extending in a second direction below the first connection layer, and wherein two adjacent gate-conductors are separated by a pitch distance equal to a contacted poly pitch ("CPP");
a circuit cell having a first vertical boundary and a second vertical boundary extending in the second direction perpendicular to the first direction, wherein each of the first vertical boundary and the second vertical boundary crosses at least one boundary isolation region, and wherein a distance between the first vertical boundary and the second vertical boundary along the first direction is less than or equal to two CPPs;
a backside horizontal conducting line extending in the first direction in a backside first conducting layer below the substrate, wherein the backside horizontal conducting line extends across the first vertical boundary of the circuit cell; and
a backside vertical conducting line extending in the second direction in a backside second conducting layer below the backside first conducting layer, wherein the backside vertical conducting line is aligned with the first vertical boundary, and wherein the backside vertical conducting line has a width along the first direction that is larger than one half of the CPP.

16. The integrated circuit of claim 15, further comprising:
a pin-connector for the circuit cell directly connected between the backside horizontal conducting line and the backside vertical conducting line.

17. The integrated circuit of claim 15, wherein the backside horizontal conducting line extends across the first vertical boundary of the circuit cell by a distance that is less than one CPP but more than one eighth of the CPP.

18. The integrated circuit of claim 15, wherein the backside horizontal conducting line extends across the first vertical boundary of the circuit cell by a distance that is less than one CPP but more than one fourth of the CPP.

19. The integrated circuit of claim 15, wherein the backside horizontal conducting line extends across the first vertical boundary of the circuit cell by a distance that is less than one CPP but more than one half of the CPP.

20. The integrated circuit of claim 15, wherein the backside vertical conducting line has a width along the first direction that is larger than three fourths of the CPP.

* * * * *